United States Patent
Kurihara et al.

(10) Patent No.: US 8,015,534 B2
(45) Date of Patent: Sep. 6, 2011

(54) METHOD AND APPARATUS FOR ESTIMATING CORE SIZE IN DESIGNING SEMICONDUCTOR INTEGRATED CIRCUIT

(75) Inventors: Takashi Kurihara, Kasugai (JP); Kazutaka Takeuchi, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 353 days.

(21) Appl. No.: 12/252,043

(22) Filed: Oct. 15, 2008

(65) Prior Publication Data

US 2009/0064066 A1    Mar. 5, 2009

Related U.S. Application Data

(62) Division of application No. 10/823,649, filed on Apr. 14, 2004, now Pat. No. 7,454,724.

(30) Foreign Application Priority Data

Aug. 27, 2003 (JP) .................... 2003-303495

(51) Int. Cl.
*G06F 17/50* (2006.01)
(52) U.S. Cl. ........ 716/126; 716/100; 716/101; 716/118; 716/119; 716/120; 716/122; 716/127; 716/132; 716/133
(58) Field of Classification Search .......... 716/100–104, 716/118–120, 122, 126–127, 132–133
See application file for complete search history.

(56) References Cited

U.S. PATENT DOCUMENTS

| | | | |
|---|---|---|---|
| 5,821,776 A | 10/1998 | McGowan | 326/41 |
| 5,838,627 A | 11/1998 | Tomishima et al. | 365/230.3 |
| 5,946,477 A | 8/1999 | Ito | 716/9 |
| 5,963,730 A * | 10/1999 | Toyonaga et al. | 716/102 |
| 6,247,162 B1 | 6/2001 | Fujine et al. | 716/2 |
| 6,311,147 B1 | 10/2001 | Tuan et al. | 703/18 |
| 6,516,446 B2 * | 2/2003 | Anzai | 716/112 |
| 6,523,150 B1 | 2/2003 | Buffet et al. | 716/4 |
| 6,714,903 B1 | 3/2004 | Chue et al. | 703/19 |
| 6,748,572 B2 | 6/2004 | Fujine | 716/5 |
| 6,763,511 B2 | 7/2004 | Banno et al. | 716/12 |
| 6,868,374 B1 | 3/2005 | Ditlow et al. | 703/18 |
| 6,948,138 B1 | 9/2005 | Shen | 716/2 |
| 2002/0140002 A1 | 10/2002 | Suzuki et al. | |
| 2002/0199160 A1 | 12/2002 | Fujine | |

FOREIGN PATENT DOCUMENTS

| | | |
|---|---|---|
| JP | 6-29501 | 2/1994 |
| JP | 10-242283 | 9/1998 |
| JP | 10-294380 | 11/1998 |

(Continued)

OTHER PUBLICATIONS

Issue Notification issued on Oct. 29, 2008 in related U.S. Appl. No. 10/823,649.

(Continued)

*Primary Examiner* — Nghia M Doan
(74) *Attorney, Agent, or Firm* — Staas & Halsey LLP

(57) ABSTRACT

A method, apparatus, and recording medium including computer instructions for estimating the size of a core section of a semiconductor integrated circuit are provided. The method includes calculating a total net length of wires of nets and usable channel length of the core section by referring to circuit information and a layout parameter that are used to design the semiconductor integrated circuit. The method includes determining a size of the core section that satisfies conditions based on total net length and usable channel length.

8 Claims, 10 Drawing Sheets

FOREIGN PATENT DOCUMENTS

| JP | 11-297840 | 10/1999 |
| JP | 2002-197139 | 7/2002 |
| JP | 2002-299452 | 10/2002 |
| JP | 2002-368091 | 12/2002 |

OTHER PUBLICATIONS

U.S. Notice of Allowance issued on Jul. 10, 2008 in related U.S. Appl. No. 10/823,649.

U.S. Office Action issued on Mar. 17, 2008 in related U.S. Appl. No. 10/823,649.

U.S. Office Action issued on Sep. 17, 2007 in related U.S. Appl. No. 10/823,649.

U.S. Office Action issued on Mar. 28, 2007 in related U.S. Appl. No. 10/823,649.

U.S. Office Action issued on Jan. 29, 2007 in related U.S. Appl. No. 10/823,649.

U.S. Office Action issued on Jul. 28, 2006 in related U.S. Appl. No. 10/823,649.

U.S. Office Action issued on May 3, 2006 in related U.S. Appl. No. 10/823,649.

* cited by examiner (Initial state)

(Eliminated state)

Changed or eliminated pads

METHOD AND APPARATUS FOR ESTIMATING CORE SIZE IN DESIGNING SEMICONDUCTOR INTEGRATED CIRCUIT

CROSS-REFERENCE TO RELATED APPLICATIONS

This application is a divisional application of and claims benefit to U.S. application Ser. No. 10/823,649, filed on Apr. 14, 2004 now U.S. Pat. No. 7,454,724, now allowed and is related to and claims priority to Japanese Patent Application No. 2003-303495, filed on Aug. 27, 2003 and incorporated by reference herein.

BACKGROUND

1. Field

The present invention relates to an apparatus and a method for efficiently designing a semiconductor integrated circuit.

To produce a semiconductor integrated circuit (LSI), a floor plan is designed based on a netlist obtained through logic synthesizing. Cells are arranged and routed in accordance with the floor plan to layout the circuit in detail, The circuit undergoes simulation to determine whether the layout of the circuit guarantees signal integrity (SI) and power integrity (PI).

The determination of whether the SI or the PI may be guaranteed is performed by determining whether or not an IR drop value (voltage drop value) exceeds a maximum value or by determining whether or not the value of the current flowing through an input/output buffer (hereafter referred to as IO buffer) exceeds a current capacity value. When the SI and PI cannot be guaranteed, the layout of the circuit must be redesigned.

The redesigning increases the design time and raises the design cost. It is thus important that redesigning be decreased.

One reason causing the IR drop value to exceed a maximum value (hereafter referred to as maximum IR drop value) or causing the value of the current flowing through the IO buffer to exceed the current capacity value (hereafter referred to as current capacity) is in that the quantity and locations (provisional quantity and provisional locations) of power supply pads determined through initial designing prior to the detailed routing of the circuit is inappropriate. Thus, in the prior art, the provisional quantity and locations of the power supply pads cannot be accurately determined.

In one prior art example, the provisional quantity and locations of the power supply pads are determined as described below.

(1) Rules are established based on past experience to obtain the quantity of power supply pads required to reduce simultaneous switching noise in an output buffer. The quantity of power supply pads may be determined in accordance with the rules.

(2) A clock buffer or the like is adjoined each power supply pad for the noise decrease.

In the prior art, the determination of the provisional quantity and provisional locations of the power supply pads is based on past experience mainly from the viewpoint of countering noise.

Japanese Laid-Out Patent Publication Nos. 11-297840 and 10-294380 describe processes for estimating chip size (more specifically, core size) before laying out the circuitry. In the process described in Japanese Laid-Out Patent Publication No. 11-297840, when predicting the wire length of a core section, factors of a netlist that affect the value of the wire length is not taken into consideration. In the process described in Japanese Laid-Out Patent Publication No. 10-294380, the wire region required around a circuit block may be determined from the arrangement of the circuit block.

2. Description of the Related Art

One aspect of the present invention is a method for provisionally determining quantity and positions of a plurality of power supply pads when designing a semiconductor integrated circuit including a core section provided with a plurality of nodes and the plurality of power supply pads, with each power supply pad being connected to the core section via an IO buffer. Each IO buffer has a predetermined current capacity. The method includes performing a power supply network analysis of the core section based on power consumption information of the core section and power supply wire resistance information, which includes resistances between the nodes, to calculate voltage values of the nodes. The method further includes calculating current values between the nodes from the voltage values of the nodes and the resistances between the nodes, calculating current values of the power supply pads from the current values between the nodes, determining whether the current value of each of the power supply pads exceeds the current capacity of the associated IO buffer, and eliminating or adding at least one power supply pad in accordance with the result of the determination.

Another aspect of the present invention is a method for provisionally determining quantity and positions of a plurality of power supply pads before detailed design of a semiconductor integrated circuit. The semiconductor integrated circuit includes a core section provided with a plurality of nodes and a plurality of power supply pads. The method includes initially defining all of the pads as power supply pads at which the potential is the same, and performing a power supply network analysis of the core section based on power consumption information of the core section and power supply wire resistance information, which includes resistances between the nodes, to calculate voltage values of the nodes. The method further includes calculating current values between the nodes from the voltage values of the nodes and the resistances between the nodes, calculating current values of the power supply pads from the current values between the nodes, determining whether there is a power supply pad for which current value is less than or equal to a predetermined current capacity, and adding a new power supply pad near a power supply pad for which current value exceeds the predetermined current capacity, and assigning a power supply pad as another type of pad when the current value of that power supply pad is less than or equal to the predetermined current capacity.

A further aspect of the present invention is a method for estimating the size of a core section of a semiconductor integrated circuit. The core section includes a plurality of nets, each including a plurality of wires. The method includes calculating the total net length of the wires of the nets and usable channel length of the core section by referring to circuit information and a layout parameter that are used to design the semiconductor integrated circuit. The total net length is the sum of the lengths of a plurality of first wires extending in a predetermined first direction and the lengths of a plurality of second wires extending in a second direction perpendicular to the first direction, and the usable channel length is the sum of a channel length in the first direction and a channel length in the second direction. The method further includes calculating the total length of the first wires, calculating the total length of the second wires, and determining the size of the core section that satisfies conditions of the total net length being less than or equal to the usable channel length, the total length of the first wires being less than or equal to the channel length in the first direction, and the total length of the second wires being less than or equal to the channel length in the second direction.

A further aspect of the present invention is a method for estimating the size of a core section in a semiconductor integrated circuit provided with a plurality of circuit blocks and the core section, which includes a plurality of repeater cells arranged between the circuit blocks. The method includes calculating the total area of the circuit blocks, calculating the area of a wire region extending around each circuit block to receive wires in order to calculate the total area of the wire regions of the circuit blocks, calculating the total area of the repeater cells, and calculating the size of the core section by totaling the total area of the circuit blocks, the total area of the wire regions, and the total area of the repeater cells.

A further aspect of the present invention is a method for estimating provisional wire capacitance in a semiconductor integrated circuit including a plurality of nets, each having a plurality of wires. The method includes calculating an average path length for nets having the same fan-out by referring to circuit information and a layout parameter that are used to design the semiconductor integrated circuit, calculating an average net length of the nets having the same fan-out based on the average path length calculated for nets having the same fan-out, and estimating the provisional wire capacity for nets having the same fan-out based on the average net length and the capacity per unit length of the associated wires.

A further aspect of the present invention is a method for estimating the size of a chip for a semiconductor integrated circuit provided with at least one core section and a plurality of power supply pads. The core section includes a plurality of nets, each having a plurality of wires, and each of the power supply pads being connected to the core section via an IO buffer having a predetermined current capacity. The method includes calculating the total net length of the wires of the nets and the usable channel length of the core section by referring to circuit information and a layout parameter that are used to design the semiconductor integrated circuit. The total net length is the sum of the lengths of a plurality of first wires extending in a predetermined first direction and the lengths of a plurality of second wires extending in a second direction perpendicular to the first direction. The usable channel length is the sum of a channel length in the first direction and a channel length in the second direction. The method further includes determining the size of the core section that satisfies conditions of the total net length being less than or equal to the usable channel length, the total length of the first wires being less than or equal to the channel length in the first direction, and the total length of the second wires being less than or equal to the channel length in the second direction. Additionally, the method includes performing a power supply network analysis of the core section based on power consumption information of the core section and power supply wire resistance information, which includes resistances between the nodes, to calculate voltage values of the nodes, calculating current values between the nodes from the voltage values of the nodes and the resistances between the nodes, calculating current values of the power supply pads from the current values between the nodes, determining whether there is a power supply pad for which current value exceeds the predetermined current capacity, eliminating or adding a power supply pad in accordance with the determination result and determining the quantity and locations of the power supply pads to calculate the area of an IO region in accordance with the determined quantity, and totaling the size of the core section and the area of the IO region.

A further aspect of the present invention is an apparatus for designing a semiconductor integrated circuit including a core section provided with a plurality of nodes and a plurality of power supply pads. The core section has a plurality of nets, each including a plurality of wires. Each power supply pad is connected to the core section via an IO buffer. Each IO buffer has a current capacity. The apparatus includes a storage device which stores power consumption information of the core section and power supply wire resistance information, including resistances between the nodes. A data processor is in communication with the storage device. The data processor performs a power supply network analysis of the core section by referring to the power consumption information and the power supply wire resistance information to calculate voltage values of the nodes, calculates current values between the nodes from the voltage values of the nodes and the resistances between the nodes, calculates current values of the power supply pads from the current values between the nodes, determines whether the current value of each of the power supply pads exceeds the current capacity of the associated IO buffer, and eliminates or adding a power supply pad in accordance with the result of the determination to determine the quantity and locations of the power supply pads.

A further aspect of the present invention is an apparatus for designing a semiconductor integrated circuit having a core section provided with a plurality of nets, each including a plurality of wires. The apparatus includes a storage device which stores circuit information and a layout parameter that are used to design the semiconductor integrated circuit. A data processor is in communication with the storage device. The data processor calculates the total net length of the wires of the nets and the usable channel length of the core section by referring to the circuit information and the layout parameter. The total net length is the sum of the lengths of a plurality of first wires extending in a predetermined first direction and the lengths of a plurality of second wires extending in a second direction perpendicular to the first direction. The usable channel length is the sum of a channel length in the first direction and a channel length in the second direction. The data processor further determines the size of the core section that satisfies conditions including the total net length being less than or equal to the usable channel length, the total length of the first wires being less than or equal to the channel length in the first direction, and the total length of the second wires being less than or equal to the channel length in the second direction.

A further aspect of the present invention is an apparatus for designing a semiconductor integrated circuit provided with a core section and a plurality of power supply pads. The core section includes a plurality of nodes and a plurality of nets, each net having a plurality of wires. Each of the power supply pads is connected to the core section via an IO buffer having a predetermined current capacity. The apparatus includes a storage device which stores power consumption information of the core section, power supply wire resistance information, which includes resistances between the nodes, and circuit information and a layout parameter that are used to design the semiconductor integrated circuit. A data processor is in communication with the storage device. The data processor calculates the total net length of the wires of the nets and the usable channel length of the core section by referring to the circuit information and the layout parameter. The total net length is the sum of the lengths of a plurality of first wires extending in a predetermined first direction and the lengths of a plurality of second wires extending in a second direction perpendicular to the first direction, and the usable channel length is the sum of a channel length in the first direction and a channel length in the second direction. The data processor further determines the size of the core section that satisfies conditions of the total net length being less than or equal to the usable channel length, the total length of the first wires being less than or equal to the channel length in the first direction, and the total length of the second wires being less than or equal to the channel length in the second direction. Additionally, the data processor performs a power supply network analysis of the core section by referring to the determined size of the core section, the power consumption information, and the power supply wire resistance information to calculate voltage values of the nodes. The data processor further calculates current values between the nodes from the voltage values of the nodes and the resistances between the nodes, calculates current values of the power supply pads from the current values between the nodes, determines whether there is a power supply pad for which current value exceeds the current capacity of the associated 10 buffer, and eliminates or adds a power supply pad in accordance with the result of the determination to determine the quantity and locations of the power supply pads.

In the present invention, conditions of IR drop value and IO buffer current capacity that guarantee Si and Pi can be satisfied when the circuit is laid out for the first time. As a result, redesigning of the layout of the circuit and a major correction, such as reselecting the LSI package or changing the chip size will not be necessary, In the present invention, when estimating the wire length of a core section, factors of a netlist that affect the value of the wire length is taken into consideration. Thus, the core size can be accurately estimated. Further, in the present invention, a circuit block and the wire region required around the circuit block are determined. Thus, even if there are many circuit blocks, it is easy to accurately estimate the core size.

Other aspects and advantages of the present invention will become apparent from the following description, taken in conjunction with the accompanying drawings, illustrating by way of example the principles of the invention.

SUMMARY

It is an aspect of the embodiments discussed herein to provide a method for provisionally determining quantity and positions of a plurality of power supply pads when designing a semiconductor integrated circuit including a core section provided with a plurality of nodes and the plurality of power supply pads, with each power supply pad being connected to the core section via an IO buffer. Each IO buffer has a predetermined current capacity. The method includes performing a power supply network analysis of the core section based on power consumption information of the core section and power supply wire resistance information, which includes resistances between the nodes, to calculate voltage values of the nodes, The method further includes calculating current values between the nodes from the voltage values of the nodes and the resistances between the nodes, calculating current values of the power supply pads from the current values between the nodes, determining whether the current value of each of the power supply pads exceeds the current capacity of the associated IO buffer, and eliminating or adding at least one power supply pad in accordance with the result of the determination.

Another aspect of the present invention is a method for provisionally determining quantity and positions of a plurality of power supply pads before detailed design of a semiconductor integrated circuit. The semiconductor integrated circuit includes a core section provided with a plurality of nodes and a plurality of power supply pads. The method includes initially defining all of the pads as power supply pads at which the potential is the same, and performing a power supply network analysis of the core section based on power consumption information of the core section and power supply wire resistance information, which includes resistances between the nodes, to calculate voltage values of the nodes, The method further includes calculating current values between the nodes from the voltage values of the nodes and the resistances between the nodes, calculating current values of the power supply pads from the current values between the nodes, determining whether there is a power supply pad for which current value is less than or equal to a predetermined current capacity, and adding a new power supply pad near a power supply pad for which current value exceeds the predetermined current capacity, and assigning a power supply pad as another type of pad when the current value of that power supply pad is less than or equal to the predetermined current capacity.

A further aspect of the present invention is a method for estimating the size of a core section of a semiconductor integrated circuit. The core section includes a plurality of nets, each including a plurality of wires. The method includes calculating the total net length of the wires of the nets and usable channel length of the core section by referring to circuit information and a layout parameter that are used to design the semiconductor integrated circuit. The total net length is the sum of the lengths of a plurality of first wires extending in a predetermined first direction and the lengths of a plurality of second wires extending in a second direction perpendicular to the first direction, and the usable channel length is the sum of a channel length in the first direction and a channel length in the second direction. The method further includes calculating the total length of the first wires, calculating the total length of the second wires, and determining the size of the core section that satisfies conditions of the total net length being less than or equal to the usable channel length, the total length of the first wires being less than or equal to the channel length in the first direction, and the total length of the second wires being less than or equal to the channel length in the second direction.

A further aspect of the present invention is a method for estimating the size of a core section in a semiconductor integrated circuit provided with a plurality of circuit blocks and the core section, which includes a plurality of repeater cells arranged between the circuit blocks. The method includes calculating the total area of the circuit blocks, calculating the area of a wire region extending around each circuit block to receive wires in order to calculate the total area of the wire regions of the circuit blocks, calculating the total area of the repeater cells, and calculating the size of the core section by totaling the total area of the circuit blocks, the total area of the wire regions, and the total area of the repeater cells.

A further aspect of the present invention is a method for estimating provisional wire capacitance in a semiconductor integrated circuit including a plurality of nets, each having a plurality of wires. The method includes calculating an average path length for nets having the same fan-out by referring to circuit information and a layout parameter that are used to design the semiconductor integrated circuit, calculating an average net length of the nets having the same fan-out based on the average path length calculated for nets having the same fan-out, and estimating the provisional wire capacity for nets having the same fan-out based on the average net length and the capacity per unit length of the associated wires.

A further aspect of the present invention is a method for estimating the size of a chip for a semiconductor integrated circuit provided with at least one core section and a plurality of power supply pads. The core section includes a plurality of nets, each having a plurality of wires, and each of the power supply pads being connected to the core section via an IO buffer having a predetermined current capacity. The method includes calculating the total net length of the wires of the nets and the usable channel length of the core section by referring to circuit information and a layout parameter that are used to design the semiconductor integrated circuit. The total net length is the sum of the lengths of a plurality of first wires extending in a predetermined first direction and the lengths of a plurality of second wires extending in a second direction perpendicular to the first direction. The usable channel length is the sum of a channel length in the first direction and a channel length in the second direction. The method further includes determining the size of the core section that satisfies conditions of the total net length being less than or equal to the usable channel length, the total length of the first wires being less than or equal to the channel length in the first direction, and the total length of the second wires being less than or equal to the channel length in the second direction. Additionally, the method includes performing a power supply network analysis of the core section based on power consumption information of the core section and power supply wire resistance information, which includes resistances between the nodes, to calculate voltage values of the nodes, calculating current values between the nodes from the voltage values of the nodes and the resistances between the nodes, calculating current values of the power supply pads from the current values between the nodes, determining whether there is a power supply pad for which current value exceeds the predetermined current capacity, eliminating or adding a power supply pad in accordance with the determination result and determining the quantity and locations of the power supply pads to calculate the area of an IO region in accordance with the determined quantity, and totaling the size of the core section and the area of the IO region.

A further aspect of the present invention is an apparatus for designing a semiconductor integrated circuit including a core section provided with a plurality of nodes and a plurality of power supply pads. The core section has a plurality of nets, each including a plurality of wires. Each power supply pad is connected to the core section via an IO buffer. Each IO buffer has a current capacity. The apparatus includes a storage device which stores power consumption information of the core section and power supply wire resistance information, including resistances between the nodes. A data processor is in communication with the storage device. The data processor performs a power supply network analysis of the core section by referring to the power consumption information and the power supply wire resistance information to calculate voltage values of the nodes, calculates current values between the nodes from the voltage values of the nodes and the resistances between the nodes, calculates current values of the power supply pads from the current values between the nodes, determines whether the current value of each of the power supply pads exceeds the current capacity of the associated IO buffer, and eliminates or adding a power supply pad in accordance with the result of the determination to determine the quantity and locations of the power supply pads.

A further aspect of the present invention is an apparatus for designing a semiconductor integrated circuit having a core section provided with a plurality of nets, each including a plurality of wires. The apparatus includes a storage device which stores circuit information and a layout parameter that are used to design the semiconductor integrated circuit. A data processor is in communication with the storage device. The data processor calculates the total net length of the wires of the nets and the usable channel length of the core section by referring to the circuit information and the layout parameter. The total net length is the sum of the lengths of a plurality of first wires extending in a predetermined first direction and the lengths of a plurality of second wires extending in a second direction perpendicular to the first direction. The usable channel length is the sum of a channel length in the first direction and a channel length in the second direction. The data processor further determines the size of the core section that satisfies conditions including the total net length being less than or equal to the usable channel length, the total length of the first wires being less than or equal to the channel length in the first direction, and the total length of the second wires being less than or equal to the channel length in the second direction.

A further aspect of the present invention is an apparatus for designing a semiconductor integrated circuit provided with a core section and a plurality of power supply pads. The core section includes a plurality of nodes and a plurality of nets, each net having a plurality of wires. Each of the power supply pads is connected to the core section via an IO buffer having a predetermined current capacity. The apparatus includes a storage device which stores power consumption information of the core section, power supply wire resistance information, which includes resistances between the nodes, and circuit information and a layout parameter that are used to design the semiconductor integrated circuit. A data processor is in communication with the storage device. The data processor calculates the total net length of the wires of the nets and the usable channel length of the core section by referring to the circuit information and the layout parameter. The total net length is the sum of the lengths of a plurality of first wires extending in a predetermined first direction and the lengths of a plurality of second wires extending in a second direction perpendicular to the first direction, and the usable channel length is the sum of a channel length in the first direction and a channel length in the second direction. The data processor further determines the size of the core section that satisfies conditions of the total net length being less than or equal to the usable channel length, the total length of the first wires being less than or equal to the channel length in the first direction, and the total length of the second wires being less than or equal to the channel length in the second direction. Additionally, the data processor performs a power supply network analysis of the core section by referring to the determined size of the core section, the power consumption information, and the power supply wire resistance information to calculate voltage values of the nodes. The data processor further calculates current values between the nodes from the voltage values of the nodes and the resistances between the nodes, calculates current values of the power supply pads from the current values between the nodes, determines whether there is a power supply pad for which current value exceeds the current capacity of the associated 10 buffer, and eliminates or adds a power supply pad in accordance with the result of the determination to determine the quantity and locations of the power supply pads.

In the present invention, conditions of IR drop value and IO buffer current capacity that guarantee SI and PI can be satisfied when the circuit is laid out for the first time. As a result, redesigning of the layout of the circuit and a major correction, such as reselecting the LSI package or changing the chip size will not be necessary. In the present invention, when estimating the wire length of a core section, factors of a netlist that affect the value of the wire length is taken into consideration. Thus, the core size can be accurately estimated. Further, in the present invention, a circuit block and the wire region required around the circuit block are determined. Thus, even if there are many circuit blocks, it is easy to accurately estimate the core size.

These together with other aspects and advantages which will be subsequently apparent, reside in the details of construction and operation as more fully hereinafter described and claimed, reference being had to the accompanying drawings forming a part hereof wherein like numerals refer to like parts throughout.

DETAILED DESCRIPTION OF THE EMBODIMENTS

A designing method and designing apparatus for a semiconductor integrated circuit (LSI) according to a first embodiment of the present invention will now be discussed. In the designing method, the first embodiment relates to initial designing that is performed before designing the layout of a semiconductor integrated circuit.

Figure 1:
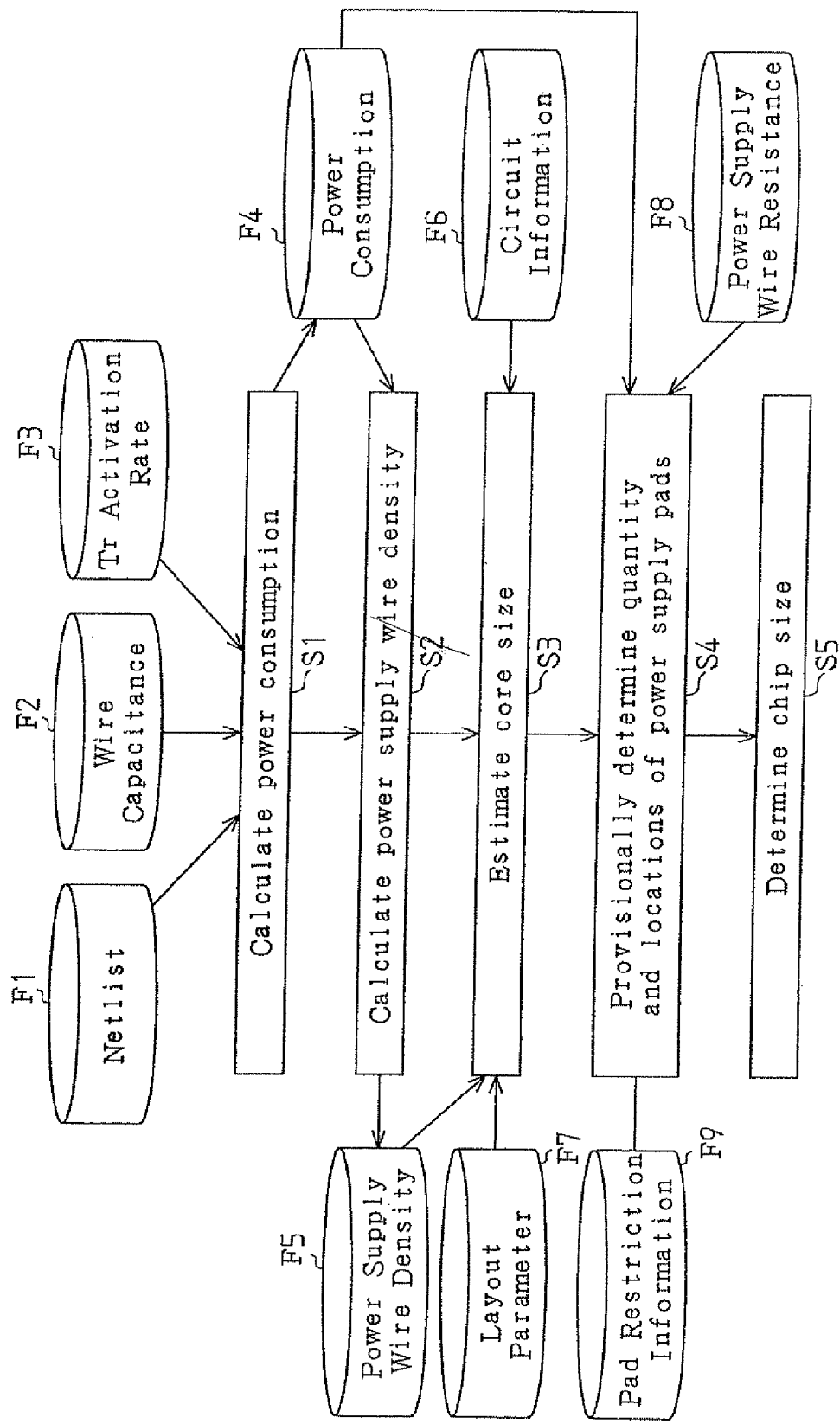
FIG. 1 is a flowchart illustrating a process for estimating chip size according to a first embodiment of the present invention.
Figure 2:
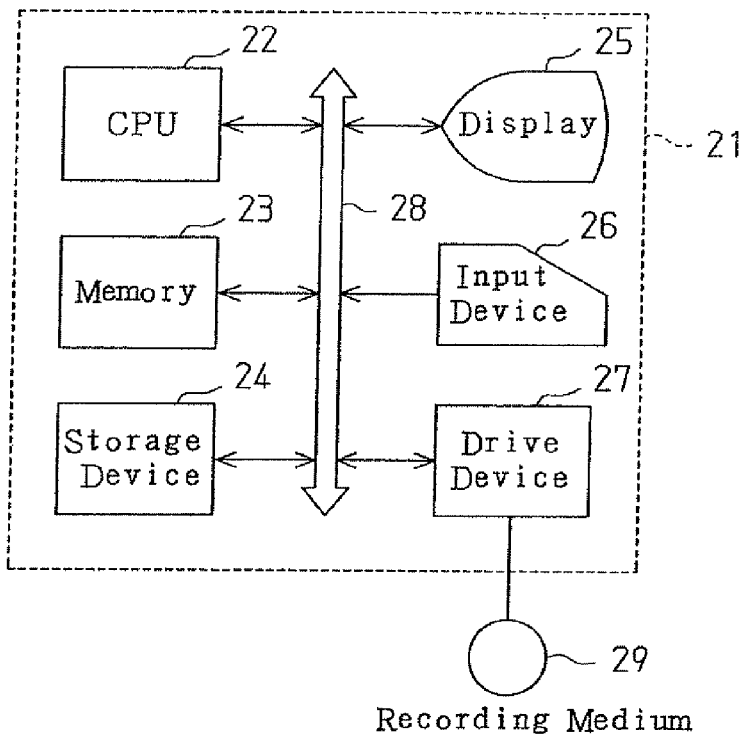
FIG. 2 is a schematic diagram of a designing apparatus according to the first embodiment of the present invention.

FIG. 1 is a flowchart illustrating a process for estimating chip size during initial designing. The process is executed by a central processing unit (CPU) 22 of a designing apparatus 21, which is shown in FIG. 2. The CPU 22 functions to calculate power consumption, calculate power supply wire density, estimate core size, determine quantity and locations of power supply pads, and determine chip size.

In step S1, the CPU 22 calculates the power consumption of a core section referring to a netlist file F1 obtained through logic synthesizing, a wire capacitance file F2, and a transistor (Tr) activation rate file F3 to generate a power consumption file F4.

In step S2, the CPU 22 calculates the power supply wire density that does not cause the IR drop value to exceed the maximum IR drop value (i.e., satisfy the IR drop conditions) in the core section to generate a power supply wire density file F5. The power supply wire density is the area of the power supply wire per unit area of the core section or the volume of the power supply wire per unit volume of the core section.

In step S3, the CPU 22 estimates the core size that ensures the signal wire channel region that is to be formed on the core section based on the power supply wire density file FS generated in step S2, a circuit information file F6 generated from the netlist file F1, and a layout parameter file F7. Step S3 will be described in detail later. Prior to step S4, the CPU 22 generates a power supply wire resistance file F8 from the netlist file F1.

In step S4, the CPU 22 determines the quantity and locations (provisional quantity and provisional locations) of the power supply pads based on the power consumption file F4 and the power supply wire resistance file F8. The arrangement of some power supply pads may be restricted to certain locations. For power supply pads subject to such restrictions, the CPU 22 refers to a pad restriction information file F9, which records restriction information, to roughly, or provisionally, estimate the quantity and locations of the power supply pads. The provisional quantity and provisional locations of the power supply pads obtained in step S4 are used as initial values that are used to design the layout of the semiconductor integrated circuit. Step S4 will be described in detail later.

In step S5, the CPU 22 checks whether the core size estimated in step S3 enables the routing of the provisional quantity of power supply pads at the provisional locations, which have been determined in step S4. When routing is possible, the area required for routing the power supply pads (more specifically, the area of an IO region including an IO buffer) and the area required in subsequent processes are added to the core size estimated in step S3 to estimate the chip size, When routing is not possible, the chip size may be estimated after enlarging the core size obtained in step S3 to a size that enables routing of the power supply pads obtained in step S4.

FIG. 2 is a schematic diagram of a designing apparatus in an exemplary embodiment. The designing apparatus 21 has the same configuration as a typical computer aided design (CAD) apparatus. The designing apparatus 21 includes the CPU 22, a memory 23, a storage device 24, a display 25, an input device 26, and a drive device 27, which are connected to one another by a bus 28.

The CPU 22 uses the memory 23 to execute a program for performing the chip size estimation of FIG. 1. The memory 23 is normally a cache memory, a system memory, a display memory, or the like. The display 25, which is used to show a processing result page or a parameter input page, is normally a CRT, an LCD, or a PDP. The input device 26 is used by a user to input requests, instructions, and parameters, and is, for example, a keyboard and a mouse.

The storage device 24 is normally a magnetic disk device, an optical disc device, a magneto-optic disc device, or the like. The storage device 24 sores the files F1 to F9, which store programs for performing various processes and the data required to execute the programs. In response to an instruction from the input device 26, the CPU 22 transfers programs and data stored in various files to the memory 23 and sequentially executes the programs. The storage device 24 is used as a database.

Programs stored on a recording medium 29 are provided to the designing apparatus 21. The drive device 27 drives the recording medium 29 and accesses the stored contents. The CPU 22 reads programs from the recording medium 29 via the drive device 27 and installs the programs in the storage device 24.

Any type of recording medium, such as an optical disc (e.g., CD-ROM and DVD-ROM) or a magneto-optic disc (e.g., MO and MD), may be used as the recording medium 29. The recording medium 29 may also be a medium or a disk device that uploads or downloads programs via a communication medium.

The determination of the provisional quantity and provisional locations of the power supply pads (the process of step S4 in FIG. 1) will now be discussed with reference to FIGS. 3 to 10.

Figure 3:
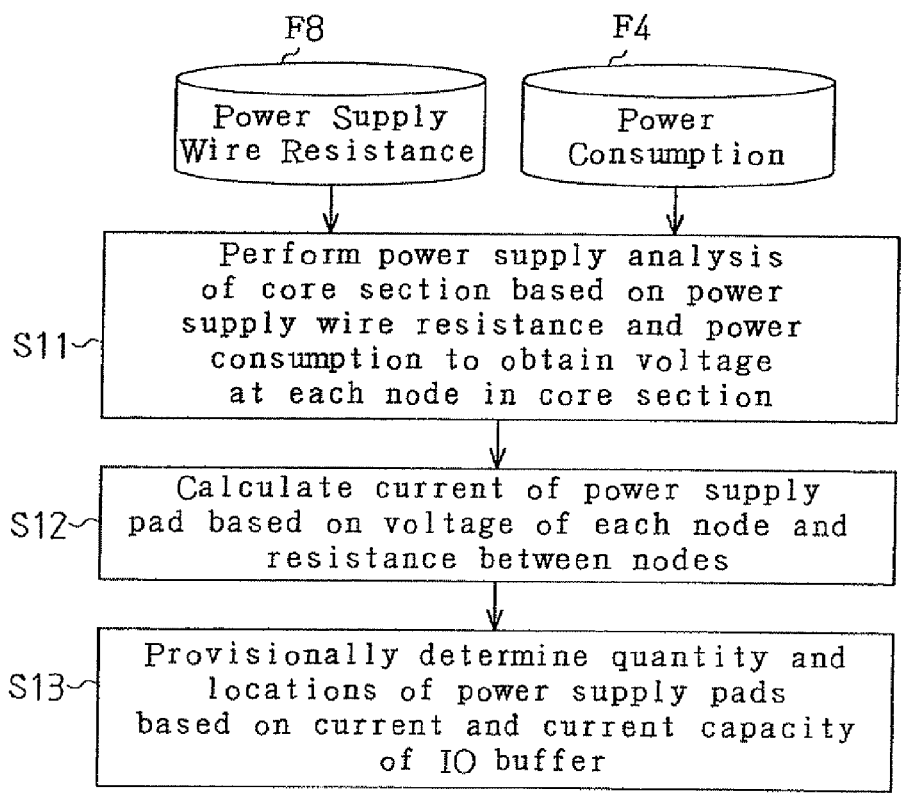
FIG. 3 is a flowchart illustrating a process for estimating the quantity and locations of power supply pads according to the first embodiment of the present invention.

In step S11 of FIG. 3, the CPU 22 performs power supply network analysis of the core section based on the power consumption file F4 and the power supply wire resistance file F8 to obtain the voltage value at each node in the core section. If each IR drop value between the nodes exceeds the maximum IR drop value, the CPU 22 suspends processing.

In step S12, the CPU 22 calculates the value of the current flowing through each node based on the calculated voltage value at each node and the resistances between the nodes stored in the power supply wire resistance file F8.

In step S13, the CPU 22 determines the provisional quantity and provisional locations of the power supply pads based on the calculated value of the current flowing through each power supply pad and the current capacity of the associated IO buffer, which is connected to the power supply pad. More specifically, the CPU 22 compares the value of the current flowing through each power supply pad with the current capacity of the associated IO buffer. If the value of the current flowing through each power supply pad exceeds the current capacity, the CPU 22 adds a new power supply pad in the vicinity of that power supply pad. If the value of the current flowing through each power supply pad is less than or equal to the current capacity, deletion (elimination or change in type of pad) of power supply pads is enabled, as will be described later.

Figure 4:
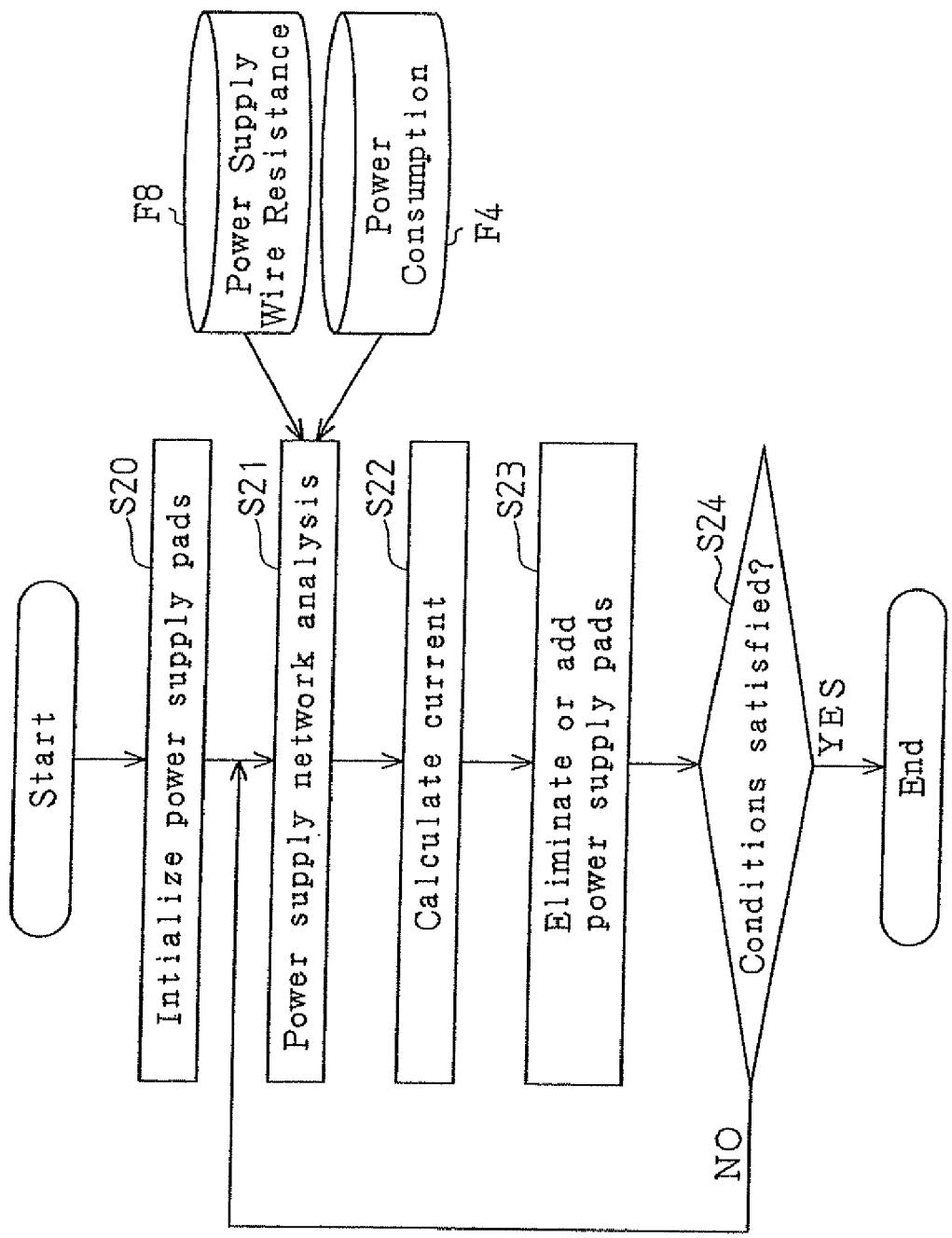
FIG. 4 is a flowchart illustrating the flowchart of FIG. 3 in detail.

The processing of FIG. 3 will now be discussed in detail with reference to FIG. 4.

Figure 5A:
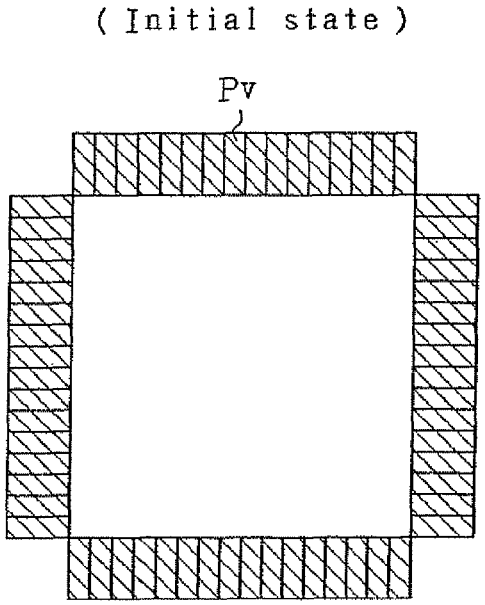
FIG. 5A is a schematic diagram of a chip prior to elimination of power supply pads.

In step S20, the initialization of power supply pads is performed prior to step S11 of FIG. 3. More specifically, all of the pads (power supply pads including those at which the potential differs) arranged on the device (semiconductor integrated circuit) subject to designing are initially defined as power supply pads Pv at which the potentials are the same (FIG. 5A). Hereafter, the power supply pads Pv set at the same potential are referred to as initial power supply pads Pv.

Then, in step S21, the CPU 22 performs power supply network analysis based on the power consumption file F4 and the power supply wire resistance file F8 to obtain the voltage value of each node. When each IR drop value between the nodes exceeds the maximum IR drop value, the CPU 22 suspends processing at that point in time.

In an exemplary embodiment, the power supply network analysis is simplified by modeling the core section in the following manner. First, the interior of the core section is approximated as a plurality of power units (PUs), each of which is configured by a resistor and a power supply. The power units are electrically equivalent to one another. The voltage value at each node connecting the PUs may be obtained.

In step S22, the CPU 22 calculates the value of the current flowing through the initial power supply pads Pv based on the resistances between the nodes (the resistances between PUs) stored in the power supply wire resistance file F8.

Figure 6:
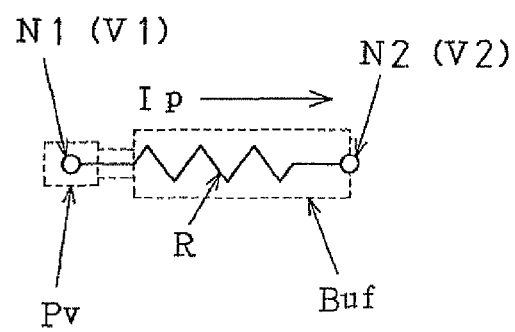
FIG. 6 is a model circuit diagram used to calculate the current amount flowing through the power supply pads.

More specifically, referring to FIG. 6, an IO buffer Buf is connected to each power supply pad Pv arranged around the chip. Each power supply pad Pv is defined as a node Ni A node connecting the associated IO buffer Buf and the core section is defined as a node N2. When the resistance between nodes N1 and N2 is approximated with resistance R, the value Ip of the current flowing between the nodes N1 and N2 may be obtained from the following equation 1.

$$Ip = |V1 - V2|/R \qquad \text{Equation 1}$$

In the equation, V1 and V2 are the voltages of nodes N1 and N2. The current value Ip corresponds to the value of the current flowing through the initial power supply pads Pv.

In step S23, the CPU 22 performs an elimination process of the initial power supply pads Pv based on the calculated current value Ip and the current capacity Ic of the IO buffer Buf.

Figure 7:
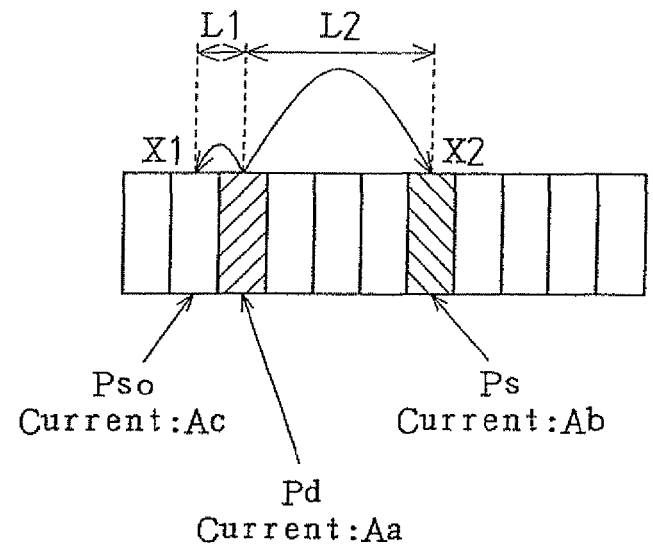
FIG. 7 is a diagram illustrating an elimination process.

The elimination process will now be discussed in detail with reference to FIG. 7. From the initial power supply pads Pv, at least one pad is selected as a reference pad Ps. Among the power supply pads arranged around the chip, the CPU 22 selects a pad having a restricted location based on the pad restriction information file Fg. In an exemplary embodiment, a pad satisfying at least one of the conditions described below is selected as the reference pad Ps.

A power supply pad for which location is restricted to solve noise problems, such as simultaneous switching noise of the output buffer.

A power supply for which location is restricted due to the specification of package pins.

A power supply pad having a current value that is greater than the two power supply pads arranged next to that power supply pad.

A power supply pad at which current is concentrated (current value being greater than or equal to a predetermined value).

A power supply pad having a fixed location due to other restrictions of the designed device.

Subsequent to the selection of the reference pad Ps, the CPU 22 determines whether elimination of the initial power supply pads Pv, excluding the reference pad Ps, is possible. In other words, the CPU 22 checks whether the initial power supply pads Pv may be used as pads having purposes other than those of power supply pads.

The elimination process is started from the two initial power supply pads Pv located next to the reference pad Ps and then performed going one-by-one to the next power supply pad Pv. More specifically, referring to FIG. 7, the current value Aa of the pad Pd subject to the elimination process is first distributed at a predetermined ratio between the reference pad Ps and an adjacent pad Pso, which is located adjacent to the pad Pd subject to the elimination process on the opposite side of the reference pad Ps.

In this state, the distribution ratio of the current value A may be determined in accordance with the current value of each pad Ps and Pso and the distance between the subject pad Pd and each of the pad Ps and Pso. More specifically, between the two pads Ps and Pso, more current is distributed to the pad having a greater current value and to the pad that is closer to the subject pad Pd. When Ab represents the current value of the reference pad Ps, Ac represents the current value of the pad Pso, L1 represents the distance between the subject pad Pd and the pad Pso, and L2 represents the distance between the subject pad Pd and the reference pad Ps, the distributed amounts X1 and X2 of the current value A to the pads Pso and Ps are determined from the next equation 2.

$$X1 = \frac{Aa\{Ac/(Ab+Ac) + L2/(L1+L2)\}}{2}$$
$$X2 = \frac{Aa\{Ab/(Ab+Ac) + L1/(L1+L2)\}}{2}$$

Equation 2

It is presumed that the changing rate of the current amount corresponding to movement of a predetermined unit distance is constant regardless of the location of the subject pad Pd.

As a result, the current value of the reference pad Ps subsequent to the current distribution is represented by (Ab+X2). In an exemplary embodiment, the current value (Ab+X2) of the reference pad Ps subsequent to current distribution is compared with the current capacity Ic of the IO buffer Buf connected to the reference pad Ps to determine whether elimination of the subject pad Pd is possible.

If the current value (Ab+X2) does not exceed the current capacity Ic (Ic≧(Ab+X2)), the CPU 22 returns (assigns) the subject pad Pd to a state prior to the initialization process (signal pad or power supply pad having a different potential) of step S20, If the current value (Ab+X2) exceeds the current capacity Ic (Ic<(Ab+X2)), the CPU 22 uses the subject pad Pd as a power supply pad and determines the location of the subject pad Pd.

Figure 5B:
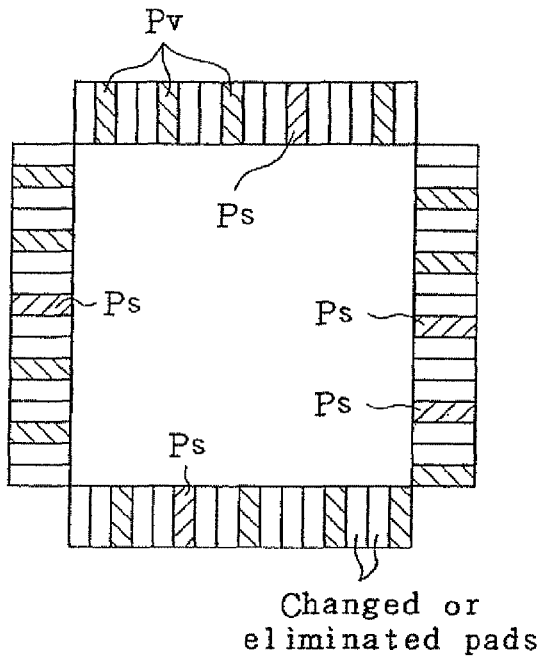
FIG. 5B is a schematic diagram of a chip subsequent to elimination of power supply pads.

Afterwards, in the same manner, the CPU 22 sequentially performs the elimination process on all of the initial power supply pads Pv excluding the reference pad Ps. Referring to FIG. 5(b), the reference pad Ps and the pads that were not eliminated during the elimination process are provisionally determined as the power supply pads.

In step S24, the CPU 22 determines whether completion conditions are satisfied. The completion conditions include whether or not pads have been eliminated in the previous elimination process. When there are no eliminated pads, the CPU 22 determines that there is no necessity to further perform the elimination process and ends the process of FIG. 4.

When there is an eliminated pad, the CPU 22 determines that the elimination process has not been completed and returns to step S21 to perform the power supply network analysis again. Then, the CPU 22 repeats the current amount calculation of step S22 and the elimination process of step S23. When performing the elimination process for a second time, from the initial power supply pads Pv that were not selected in the first elimination process, the CPU 22 selects the pad having the greatest current value as the reference pad Ps. Steps S21 to S23 are repeated until the CPU 22 determines that the elimination process has been completed in step S24.

When the quantity of power supply pads is restricted due to the specification of package pins or the like, the locations of the power supply are changed as described below to optimize the routing of the power supply pads.

After determining the provisional quantity and provisional locations of the power supply pads, the CPU 22 compares the current value of the power supply pad of which location is to be changed with the current value of an adjacent power supply (signal pads between the power supply pads are ignored). The CPU 22 moves power supply pads having small current values toward power supply pads having large current values. When the distance between the two power supply pads is represented by L, and the current values of the two power supply pads are represented by Ia and Ib (Ia>Ib), the movement amount D may be determined through the following equation 3.

$$D = L((Ia - Ib)/Ia)$$

Equation 3

In an exemplary embodiment, the items described below are taken into consideration so that the provisional quantity and provisional locations of the power supply pads are accurately determined prior to the layout of the circuitry and to optimize the quantity and locations of the power supply pads during the layout of the circuitry and after the layout of the circuitry.

Figure 8:
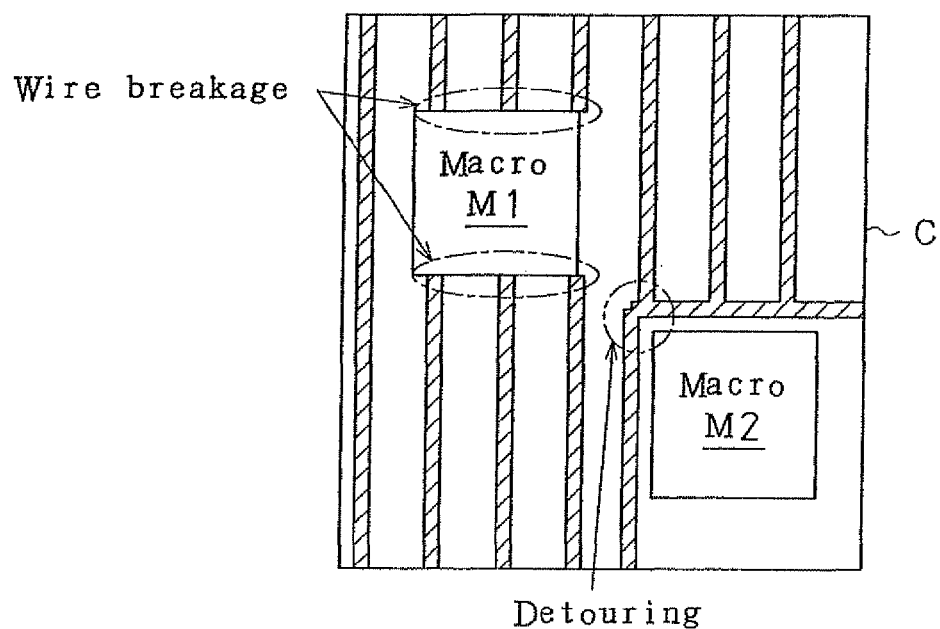
FIG. 8 is a diagram illustrating the bias (or distribution) of the power supply wire density.

When routing power supply wires in the core section C, for example, referring to FIG. 8, the arrangement of macros M1 and M2 would result in the necessity of breaking power supply wires (three are broken in FIG. 8) or detouring the macros M1 and M2. This would bias the power supply wire density in the core section C. Such bias of the power supply wire density is extracted from the layout data. Information related to the bias is stored in the power supply wire resistance file F8. The CPU 22 refers to the power supply wire resistance file F8 to perform power supply network analysis in order to optimize the quantity and locations of the power supply pads while taking into consideration the bias of the power supply wire density.

Figure 9:
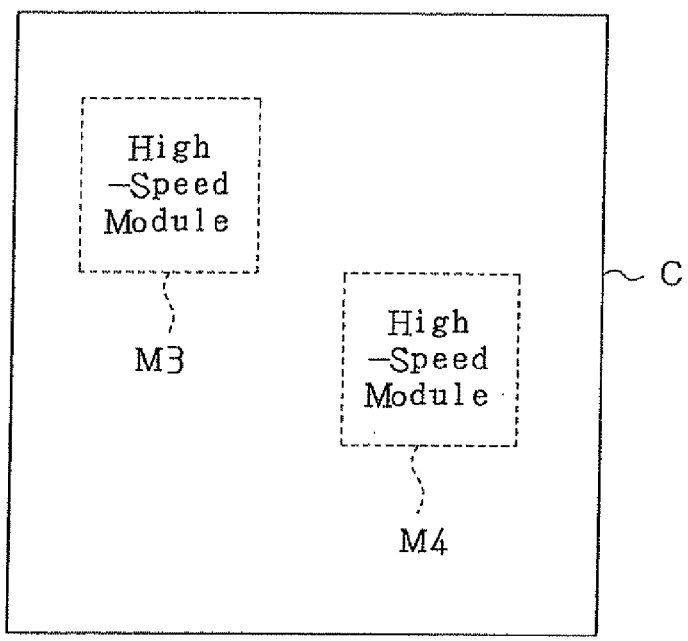
FIG. 9 is a diagram illustrating an exemplary layout of a high-speed operation module.

Referring to FIG. 9, when the core section C includes modules M3 and M4, which operate at relatively high speeds, the power consumption of the core section C is biased in accordance with the locations of the modules M3 and M4. Information related to the bias of the power consumption is stored in the power consumption file F4 for each designed inductance or each module. The CPU 22 refers to the power consumption file F4 when performing power supply network analysis so that the provisional quantity and provisional locations of the power supply pads are determined with high accuracy while taking into consideration the bias of the power consumption.

Figure 10:
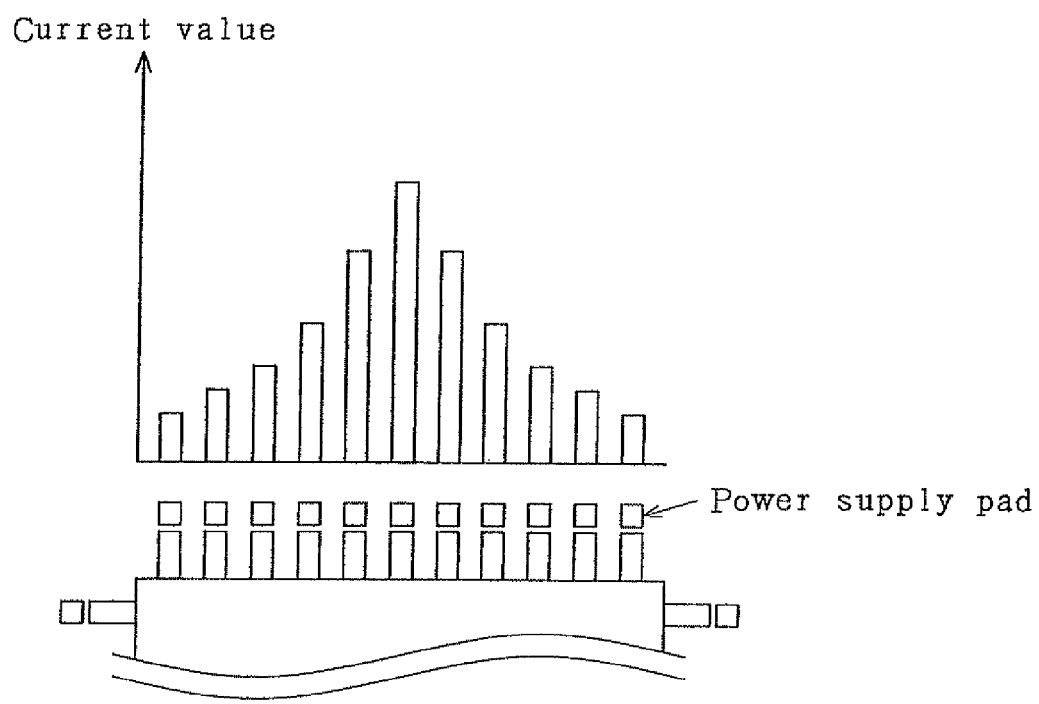
FIG. 10 is a diagram illustrating the bias (or distribution) of the current amount flowing through the power supply pads.

The amount of current flowing through the power supply pad differs depending on the location of the power supply pad. Referring to FIG. 10, in each side of a chip, the current amount normally increases as the center becomes closer and decreases as the ends become closer. Further, when power supply pads are located adjacent to power supply pads supplying power having different potentials, current tends to concentrate at those poser supply pads. Such bias of the current amount may be calculated beforehand to take into consideration bias of the current amount when performing power supply analysis. This enables the provisional quantity and provisional locations of the power supply pads to be determined with high accuracy.

An exemplary process for estimating the core size in step S3 of FIG. 1 will now be discussed.

Figure 11:
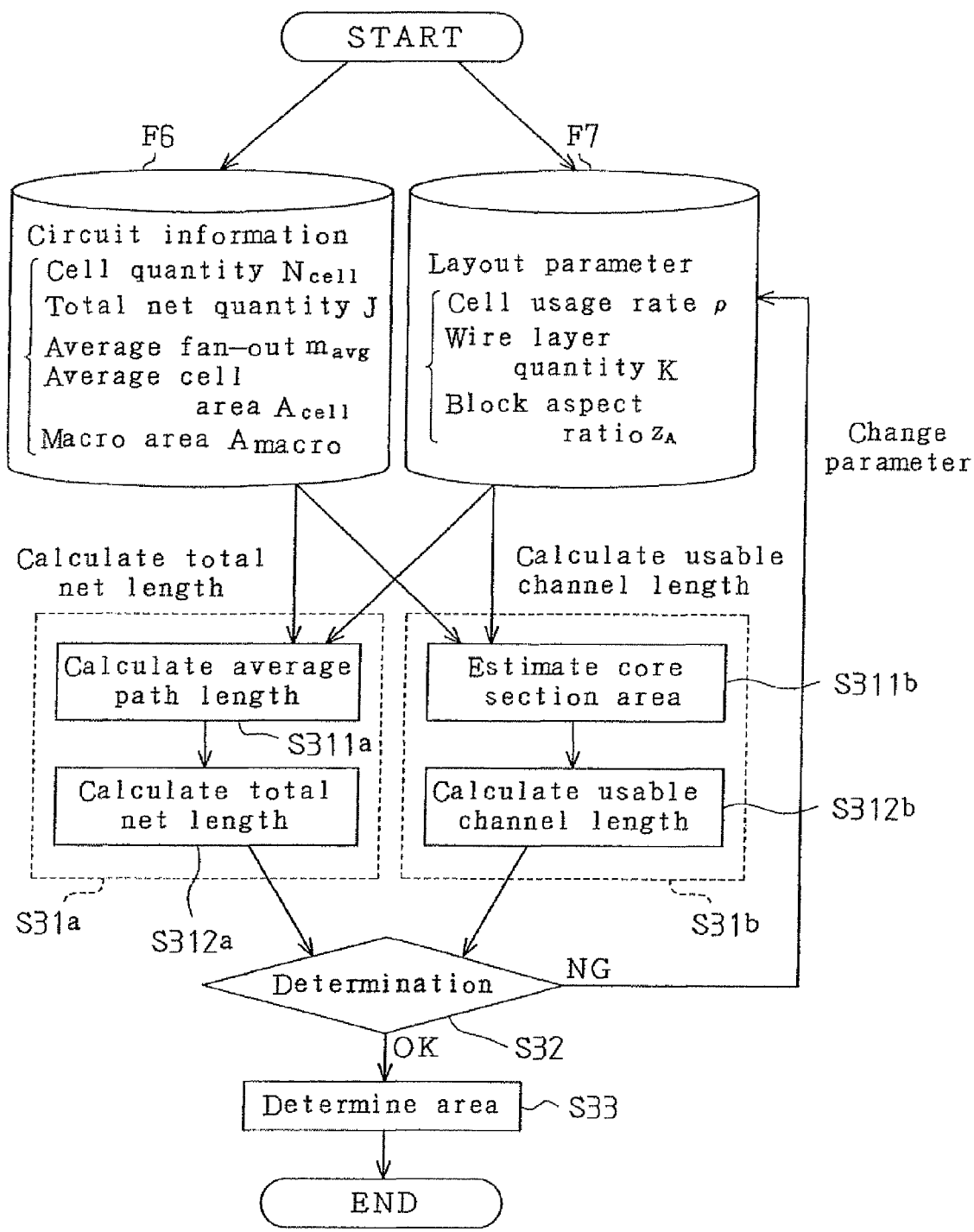
FIG. 11 is a flowchart illustrating a process for estimating core size according to the first embodiment of the present invention.

FIG. 11 is a flowchart illustrating an exemplary process for estimating the core size.

Prior to estimation of the core size, the circuit information file F6 and the layout parameter file F7 are prepared. Parameters related to various circuit information extracted from the netlist file F1 (e.g., cell quantity $N_{cell}$, total net quantity J, average fan-out $m_{avg}$, average cell area $A_{cell}$, and total area of the used macro (total macro area) $A_{macro}$) are recorded in the circuit information file F6. Parameters related to layout design (e.g., cell usage rate p, wire layer quantity K, coefficient corresponding to aspect ratio (length and width ratio) of a circuit block $z_A$) are stored in the layout parameter file F7. The cell usage rate is a value obtained by dividing the total cell area in the core section by the area of the region enabling the arrangement of cells in the core section.

In step S31a, the total net length of the core section may be calculated based on the circuit information file F6 and the layout parameter file F7. At the same time, in step S31b, the usable channel length may be calculated based on the circuit information file F6 and the layout parameter file F7.

The calculation of the total net length in step S31a will now be discussed. Step S31a includes calculation of the average path length (step S311a) and calculation of the total net length (step S312a).

In step S311a, the average path length of each net in the core section may be calculated, The path length is the length of a wire from an input terminal to an output terminal. The average path length $L_{path-idf.avg}$ may be obtained from the next equation 4 using the cell quantity $N_{cell}$, the average cell area $A_{cell}$, the cell usage rate $\rho$, and the Rent's exponent p.

$$L_{path-idf.avg} = \frac{\frac{p-0.5}{p} - \sqrt{N_{cell}} -}{\frac{p-0.5}{6\sqrt{N_{cell}}(p+0.5)} + N_{cell}^{p} \frac{4^{p-0.5}-p-1}{2(p+0.5)p(p-1)}} \times \sqrt{\frac{A_{cell}}{\rho}}$$
$$\frac{p-0.5}{6p\sqrt{N_{cell}}} + 1 - \frac{\sqrt{N_{cell}}(p-0.5)}{p-1}$$

Equation 4

(refer to J. A. Davis, V K. De, J. D. Meindi "A Stochastic Wire-Length Distribution for Gigascale Integration (GSI)—Part II: Applications to Clock Frequency, Power Dissipation, and Chip Size Estimation", IEEE Transaction on Electron Devices, Vol. 45, No. 3, March 1998)

The average path length $L_{path-idf.avg}$ may be obtained as a Manhattan length (minimum distance connecting two ends with a combination of horizontal and vertical lines). The Rent's exponent p may be calculated from the following equation 5 using the cell quantity $N_{cell}$, the total net quantity J, and the average fan-out $m_{avg}$, which are dependent on the circuit architecture.

$$p = \log_{N_{cell}}\left(1 - \frac{(m_{avg}+1) \cdot J}{a \cdot J \cdot m_{avg} + b \cdot N_{cell}}\right) + 1$$

Equation 5

In the equation 5, the coefficients a and b are values obtained from layout information obtained through past experience. In the circuit information, when some parameters are not determined (average fan-out $m_{avg}$ etc.), a predetermined default value may be used as the Rent's exponent p. In the equation for calculating the Rent's exponent p, the gate quantity may be used in lieu of the cell quantity $N_{cell}$. In such a case, the gate quantity may be the average gate quantity per cell that may be calculated beforehand.

In step S312a, the total length of all of the wires configuring the core section (total net length) may be calculated based on the fan-out of each net.

Among all of the nets, when the total of the nets having a fan-out of m is represented by $J_{FO=m}$, the net length $L_{net.FO=m}$ of the nets having fan-out m may be obtained from the following equation 6 using the average path length $L_{path-idf.avg}$.

$$L_{net.FO=m} = L_{path-idf.avg} \times t(m) \times J_{FO=m}$$

Equation 6

In the equation 7, t(m) is a function correlated with the fan-out m and the influence of detouring wires in the net of the fan-out m.

$$t(m) = m \times a_{FO=m} \times b_{FO=m}$$

Equation 7

In the equation, $a_{FO-m}$ is a function for obtaining the average path length of the net of the fan-out m. Further, $b_{FO=m}$ is a function for converting the average path length of the net of the fan-out m to average net length. Accordingly, in equation 5, $L_{path-idf.avg \times t(m)}$ is represented as the average net length $L_{net-avg\ FO=m}$ of the fan-out m. Each of the functions $a_{FO=m}$ and $b_{FO=m}$ is expressed using the fan-out m.

Equation 5 is used to calculate the net length of each net in accordance with the fan-out. The total of the net lengths of the fan-out may be obtained as the total net length $L_{net-total}$ forming the core section. In other words, the total net length $L_{net-total}$ is expressed from the following equation 8.

$$L_{net-total} = \Sigma L_{net.FO=m}$$

Equation 8

In accordance with the next equation 9, the total length (net length $L_{net-total}.X$) of a wire (first wire) in a first direction (e.g., the X axis direction in FIG. 14) and the total length (net length $L_{net-total}.Y$) of a wire (second wire) in a second direction (e.g., the Y axis direction in FIG. 14), which is perpendicular to the first direction along a horizontal plane, may be obtained from the total net length $L_{net-total}$.

$$L_{net-total.X} = L_{net-total} \times z_A$$

$$L_{net-total.Y} = L_{net-total} \times (1-z_A)$$

Equation 9

In the equation, $z_A$ represents the aspect ratio ($0 < Z_A < 1$). Then, the calculation of the usable channel length in step 31b will now be described.

Step 31b includes estimation of the area of the core section (step S311b) and calculation of the usable channel length (step S312b).

In step 311b, the cell quantity $N_{cell}$, the average cell area $A_{cell}$, the cell usage rate p, and the total macro area $A_{macro}$ are used to estimate the core section area $A_{temp-area}$. The estimated core section area Atemp-area in equation 10 is the sum of the total area of the cells arranged in the core section and the total macro area $A_{macro}$.

$$A_{temp-area} = (A_{cell}/\rho) \times N_{cell} + A_{macro}$$

Equation 10

In step S312b, the usable channel length in each wire layer may be calculated based on the estimated core section area $A_{temp-area}$.

In the following equation 11, the usage channel length Lusable.n of a certain wire layer n is the ideal usable channel length $L_{all.n}$ when presuming that the whole surface of the wire layer n is a routable region. The routing prohibition length of the wire layer n is represented by $L_{prohibit.n}$. The maximum channel usage rate of the wire layer n is represented by m.

$$L_{usable.n} = (L_{all.n} - L_{prohibit.n}) \times r_n$$

Equation 11

The ideal usable channel length $L_{all.n}$ in the wire layer n may be obtained from the value of the estimated area $A_{temp.area}$ and the aspect ratio $Z_A$. The wire prohibition channel length $L_{prohibit.n}$ may be obtained by adding the channel length used for power supply wires, the channel length that is lost by the arrangement of a hard macro, the channel length of when a wire channel is substantially lost in an intermediate wire layer due to a stuck via hole produced when an upper wire layer is connected to a lower wire layer and the channel length is known to be unusable from the beginning.

In the same manner, equation 11 is used to calculate the usable channel length in other wire layers. Then, the usable channel length of all of the wire layers is added to obtain the usable channel length Lusable-total of all of the wire layers. The usable channel length Lusable-total of all of the wire layers may be obtained from the next equation 12.

$$L_{usable\text{-}total} = \Sigma L_{usable\_n} \qquad \text{Equation 12}$$

The routing direction is normally determined for each wire layer. The usable channel length Lusable-total.X for wires routed in the first direction along a horizontal plane and the usable channel length Lusable-total.Y for wires routed in the second direction, which is perpendicular to the first direction, along the horizontal plane are each obtained by adding the usable channel lengths of wire layers having the same routing direction, The usable channel length Lusable-total.X of the first direction may be obtained by adding usable channel lengths of wire layers on which wires are routed in the first direction. The usable channel length Lusable-total.Y of the second direction may be obtained by adding usable channel lengths of wire layers on which wires are routed in the second direction.

In step S32, the total net lengths $L_{net\text{-}total}$, $L_{net\text{-}total}.Y$, and $L_{net\text{-}total}.Y$ obtained in step S31a are respectively compared with the usable channel lengths Lusable-total, Lusable-total.X, and Lusable-total.Y to determine whether all of the following conditions are satisfied.

$$L_{net\text{-}total} \leq L_{usable\text{-}total}$$

$$L_{net\text{-}total}.X \leq L_{usable\text{-}total}.X$$

$$L_{net\text{-}total}.Y \leq L_{usable\text{-}total}.Y \qquad \text{Equation 13}$$

When all of the conditions are satisfied, the routing of wires in the estimated area $A_{temp\text{-}area}$ is enabled. Accordingly the value of the estimated area $A_{temp\text{-}area}$ may be determined as the core size (step S33). When any one of the conditions is not satisfied, the layout parameter is changed and processing is restarted from step S311b. In this case, the cell usage rate ρ is decreased or the wire layer quantity K is increased to increase the estimated area to the minimal area that satisfies the conditions of equation 13.

The core size decreases as the cell usage rate ρ increases. The core size (estimated area $A_{temp\text{-}area}$) becomes minimal when the cell usage rate ρ is 100%. In other words, in such a state, the core section is fully routed without any gaps. However, routing is seldom enabled in a state in which the cell usage rate ρ is 100%. The maximum value of the cell usage rate ρ is normally less than 100% depending on the layout tool, the density of wires, and the layout TAT. The estimated area $A_{temp\text{-}area}$ of the core section is efficiently calculated by setting the maximum value of the cell usage rate ρ in accordance with such a designing environment.

In an exemplary embodiment, the total net length $L_{net\text{-}total}$ may be calculated taking into consideration the fan-out of each net. Further, the core size may be estimated based on the total net length $L_{net\text{-}total}$. As a result, the core size may be estimated while accurately estimating the total wire length of the wires routed on the core section. Thus, the provisional wire capacitance value of each net may also be accurately estimated in accordance with the fan-out of each net and the estimated area of the core section in an exemplary embodiment.

For example, the provisional wire capacitance value of a net of the fan-out may be obtained from the product of the average net length $L_{net\text{-}avg.Fo=m}$ of the fan-out m and the wire capacitance value. The average net length $L_{net\text{-}avg.FO=m}$ of the fan-out m may be obtained from "$L_{path\text{-}idf.avg} \times t(m)$" (refer to equation 5). Further, the average net length $L_{net\text{-}avg.FO=m}$ is a value proportional to the cell quantity $N_{cell}$ included in the core section. Accordingly, the provisional wire capacitance value of the net of the fan-out is accurately estimated in accordance with the fan-out m and the core size of each net.

The first embodiment includes advantages described below.

(1) The value of the current that flows through a power supply pad may be calculated from the voltage value of each node that may be obtained through the power supply network analysis. The current value and the current capacity of the IO buffer is then compared to determined the provisional quantity and provisional locations of the power supply pads. The provisional quantity and provisional locations of the power supply pads that guarantee the Si and Pt taking into consideration the current capacity of the IO buffer are accurately estimated prior to the detailed layout. This decreases redesigning, shortens the design time, and reduces design costs.

(2) After the power supply network analysis, processing is suspended when the IR drop value between nodes exceeds the maximum IR drop value. Accordingly, the provisional quantity and the provisional locations of the power supply pads that satisfy the IR drop conditions in the core section are used for the detailed layout of circuitry (3) In an exemplary embodiment, the power supply network analysis is performed by modeling a core section as a plurality of equivalent circuits (PU) that are electrically equivalent to one another in the core section. The determination of the provisional quantity and provisional locations of the power pads is facilitated by simplifying the power supply network analysis. Further, the power supply network analysis time is shortened and the design time is shortened.

(4) In an exemplary embodiment, a power supply pad of which location is restricted is used as the reference pad Ps. Further, the elimination process is performed on power supply pads (initial power supply pads Pv) excluding the reference pad Ps, This accurately determines the provisional quantity and provisional locations of the power supply pads while taking into consideration such routing restrictions.

(5) In an exemplary embodiment, the power supply network analysis is performed taking into consideration the bias of power consumption in the core section to accurately determine the provisional quantity and provisional locations of the power supply pads.

(6) In an exemplary embodiment, the power supply network analysis is performed taking into consideration the bias of the amount of current flowing through the power supply pads to accurately determine the provisional quantity and provisional locations of the power supply pads.

(7) In an exemplary embodiment, the power supply network analysis is performed taking into consideration the bias of the power supply wire density in the core section to optimize the quantity and locations of the power supply pads subsequent to layout.

(8) The core size may be estimated from the result obtained by calculating the total net length $L_{net\text{-}total}$ from the average path length $L_{path\text{-}idf.avg}$ taking into consideration the fan-out of each net and then comparing the total net length $L_{net\text{-}total}$ with the usable channel length Lusable-total. The core size may be estimated taking into consideration the fan-out of each net. Thus, the core size may be estimated accurately at a minimal area without actually performing a layout.

(9) In an exemplary embodiment, when the total net length $L_{net\text{-}total}$ and the usable channel length Lusable-total is compared, components of the wiring direction in the first and second directions are also compared. This estimates the core size further accurately.

(10) In an exemplary embodiment, the quantity and locations of the power supply pads and the core size are accurately estimated. This enables the chip size to be accurately estimated prior to layout.

(11) In the core size estimation of an exemplary embodiment the average net length $L_{net\text{-}avg.FO=m}$ is accurately obtained in accordance with the fan-out of each net. Thus, the provisional wire capacitance value of each net is accurately estimated. Accordingly, the performance of an LSI may be evaluated with high accuracy prior to layout of the circuitry.

A designing method and a designing apparatus of a semiconductor integrated circuit according to a second embodiment of the present invention will now be discussed centering on parts differing from the first embodiment, The second embodiment differs from the first embodiment in the core size estimation process of step S13 in FIG. 1. In the second embodiment, the size of a core section configured by a plurality of circuit blocks may be estimated.

Figure 12:
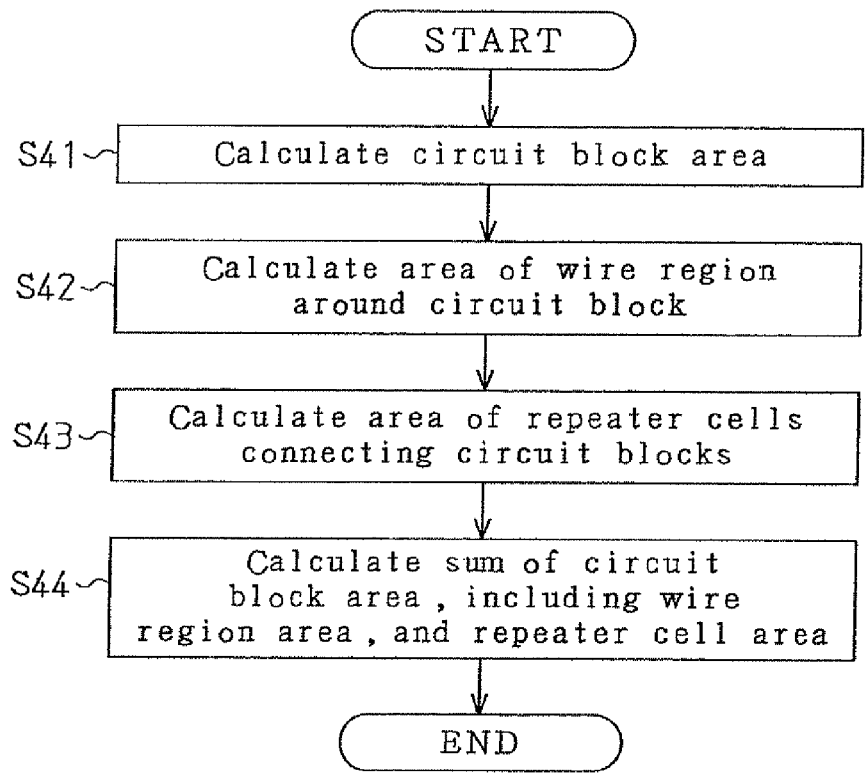
FIG. 12 is a flowchart illustrating a process for estimating core size according to a second embodiment of the present invention.

In step S41 of FIG. 12, the area of each circuit block configured in the core section and the total area of all of the circuit blocks are calculated. The area of a circuit that has been laid out in the past does not have to be calculated again. Thus, the area obtained in the past layout is used. For a circuit block that is laid out for the first time, the area may be estimated through the core size estimation of the first embodiment.

Figure 13:
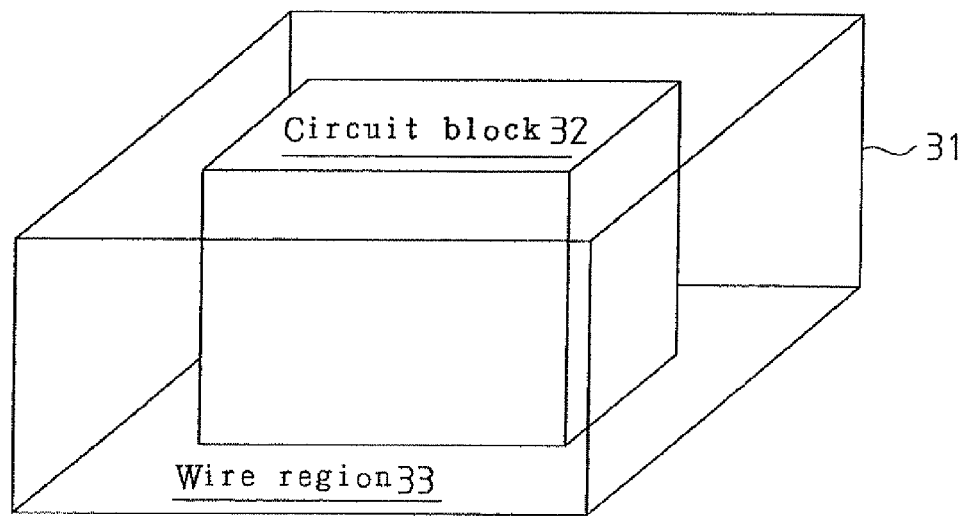
FIG. 13 is a diagram illustrating a layout block.

In step S42, the total area of the wire region required to route wires around each circuit block and the total area of all of such wire regions may be calculated. For example, referring to FIG. 13, a circuit block 32 and a wire region 33, which extends around the circuit block 32, is regarded as a layout surface (layout block in FIG. 13) to obtain the total bottom surface area of all of such layout blocks 31. Step S42 will be described in detail later.

In step S43, the total area of repeater cells arranged between the circuit blocks 32 may be calculated. When a wire connecting circuit blocks to each other is long, a repeater cell, which functions as a buffer circuit, is arranged in the wire to decrease path delay, Step S43 will be described in detail later.

In step S44, the sum of the total area of all of the layout blocks (i.e., the total area of all of the wire regions 33 and the total area of all of the circuit blocks 32) and the total area of the repeater cells are calculated to estimate the core size.

Figure 14:
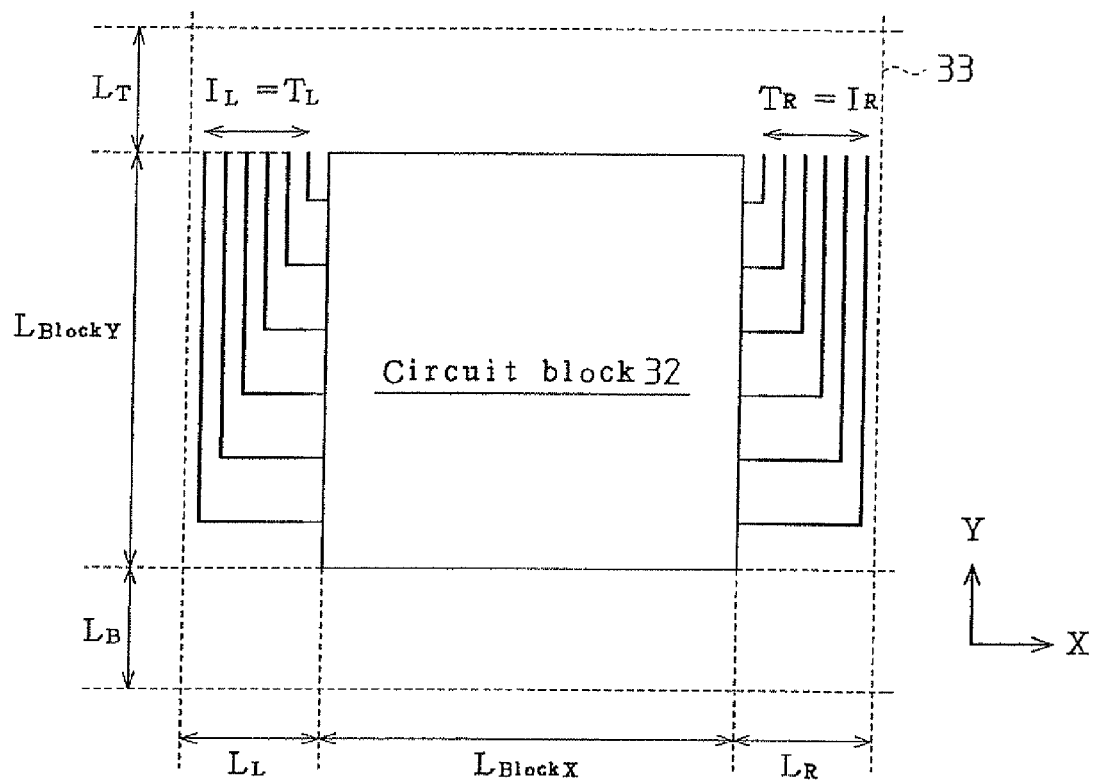
FIG. 14 is a diagram illustrating the quantity of wires required for terminals.
Figure 15:
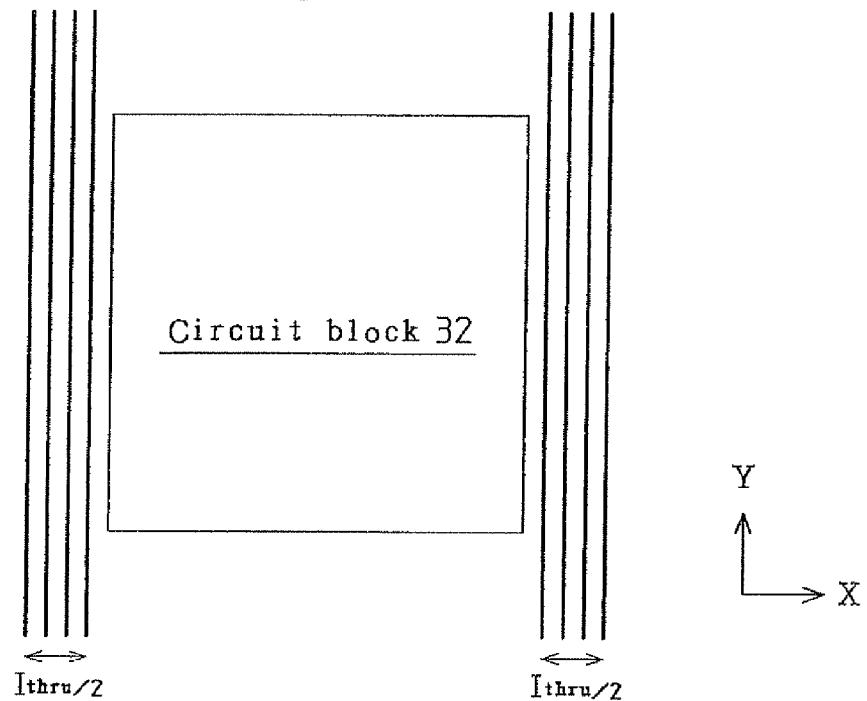
FIG. 15 is a diagram illustrating wires that pass by the layout block.

Step S42 (calculation of the area of wire region 33) will now be discussed with reference to FIGS. 14 to 16. FIG. 14 is a plan view of the circuit block 32. For the sake of brevity, the direction parallel to the X axis is referred to as a first direction, and the direction parallel to the Y axis is referred to as a second direction. As viewed in FIG. 14, the right side and left side of the circuit block 32 are parallel to the Y axis. The upper side and lower side of the circuit block 32 are parallel to the X axis. The procedures for obtaining the wire region required for routing wires outside the left and right sides of the circuit block 32 will now be discussed. The wire regions outside the upper and lower sides of the circuit block 32 are obtained in the same manner.

In process 1, the quantity of wires required for routing terminals for the circuit block 32 may be calculated.

As shown in FIG. 14, the wire quantities $I_L$ and $I_R$, which are the quantities of the wires respectively extending from the left and right sides of the circuit block 32, are respectively equal to the terminal quantities $T_L$ and $T_R$, which are the quantity of terminals extending from the left and right sides of the circuit block 32. Wire Quantity IL=Terminal Quantity $T_L$ (left side), Wire Quantity $I_R$=Terminal Quantity $T_R$ (right side).

In a process 2, the quantity $I_{detour}$ of wires that detour the circuit block 32 to connect other circuit blocks 32 may be calculated.

When the circuit block 32 lies between other circuit blocks, wires connecting the circuit blocks passes by the layout block 31. Wires passing by the layout block 31 include wires passing over the circuit block 32 and wires (detouring wires) passing over the wire region 33 outside the circuit block 32. In process 2, the quantity $I_{detour}$ of the detouring wires are obtained.

Figure 16:
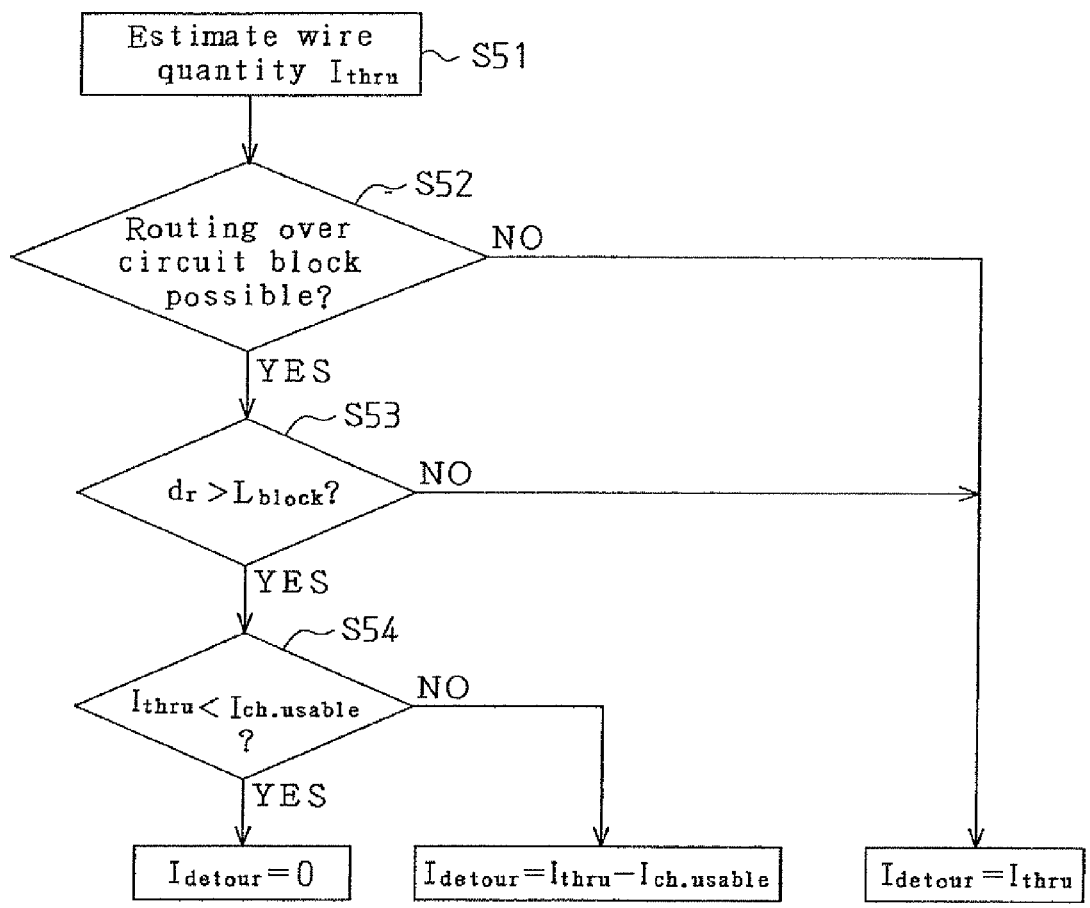
FIG. 16 is a flowchart illustrating a procedure for estimating the quantity of wires that must detour a circuit block.

FIG. 16 is a flowchart illustrating a procedure for calculating the wire quantity $I_{detour}$.

In step S51, the wire quantity $I_{thru}$ that passes by the layout block 31 may be estimated. When the quantity of circuit blocks included in a core section is represented by Nblock, the total net quantity between circuit blocks is represented by JB, the average fan-out is represented by $m_{avg}$, the Rent's exponent is represented by p, and the ratio of wires passing by the layout block 31 among the wires that are not used to connect adjacent circuit blocks is represented by c ($0 \leq c \leq 1$), the estimated wire quantity $I_{thru}$ may be calculated from the next equation 14.

$$I_{thru} = J_B \times m_{avg} \times \left( 1 - \frac{\frac{2^{2p}-1}{6p} - \frac{2\sqrt{N_{block}}(2^{2p-1}-1)}{2p-1} + \frac{N_{block}(2^{2p-2}-1)}{p-1}}{\frac{N_{block}^p(2^{2p-1}-2p-1)}{p(2p-1)(p-1)(2p-3)} - \frac{1}{6p} + \frac{2\sqrt{N_{block}}}{2p-1} - \frac{N_{block}}{p-1}} \right) \times c \quad \text{Equation 14}$$

In step S52, it may be determined whether the wires passing by the layout block 31 passes over the circuit block 32. In other words, it may be determined whether wires can be routed over the circuit block 32. More specifically, the routing channel quantity $I_{ch.usable}$, which is the quantity of channels that are routable over the circuit block 32 may be obtained When the routing channel quantity $I_{ch.usable}$ is zero, it may be determined that routing over the circuit block 32 is not possible. The routing channel quantity $I_{ch.usable}$ does not include channels that are not routable due to power supply wires.

When routing over the circuit block 32 is not possible (NO in step S52), the wires that pass by the layout block 31 all detour the circuit block 32. In other words, the relationship of $I_{detour}=I_{thru}$ is satisfied. FIG. 15 is a schematic diagram showing a state in which when the relationship of $I_{detour}=I_{thru}$ is satisfied, among the wires that pass by the layout block 31, $I_{thru}/2$ passes by each of the left and right sides of the circuit block 32.

When routing of the circuit block 32 is possible (YES in step S52), the process proceeds to step S53. In step S53, the interval dr of repeater cells arranged in wires connecting circuit blocks is compared with the length Lblock of the sides of the circuit block 32 extending in a direction that is parallel to the wires including the repeater cells (the direction of the Y axis in FIG. 15).

Under the condition of dr<Lblock (NO in step S53), routing for connecting circuit blocks cannot be performed over the circuit block 32. Thus, in the same manner as described above, the wires that pass by the layout block 31 all detour the circuit block 32 (i.e., $I_{detour}=I_{thru}$).

Under the condition of dr>Lblock (YES in step S53), routing for connecting circuit blocks can be performed over the circuit block 32 via repeater cells. In this case, the process proceeds to step S54 to compare the wire quantity $I_{thru}$ that passes by the layout block 31 with the routing channel quantity $I_{ch.usable}$ of the circuit block 32 and determine whether the routing channel quantity $I_{ch.usable}$ is greater than the wire quantity $I_{thru}$.

Under the condition of $I_{thru} < I_{ch.usable}$ (YES in step S54), the wires that pass by the layout block 31 are all wires that pass over circuit block 32. In other words, the relationship of $I_{detour} = 0$ is satisfied.

Under the condition of $I_{thru} > I_{ch.usable}$ (NO in step S54), the difference between the wire quantity $I_{thru}$ and the routing channel quantity $I_{ch.usable}$ is the quantity of wires that pass over the circuit block 32. In this case, the relationship of $I_{detour} = I_{thru} - I_{ch.usable}$ is satisfied.

In a process 3, the sum of the wire quantities $I_L$ and $I_R$ obtained in process 1 and the wire quantity $I_{detour}$ obtained in process 2 may be calculated. The sum $I_{oh}$ of the wire quantities is the estimated value of the total quantity of wires that pass by the outer side of the circuit block 32 (in this case, the left and right outer sides of the circuit block 32).

$$I_{oh} = I_L + I_R + I_{detour} \qquad \text{Equation 15}$$

In a process 4, a minimal wire region area that satisfies the wire quantity sum $I_{oh}$ obtained in process 3 may be obtained.

The minimal wire region area may be determined so that the product of the wire interval in each wire layer (e.g., wire interval in the direction of the Y axis) and routing channel quantity is the same in every wire layer and so that the sum of the routing channel quantity in every wire layer is the same as the sum $I_{oh}$. The usable routing channel quantity in each wire layer increases as the quantity of wire layers increases. This decreases the wire region. Like the routing channel quantity of the circuit block 32 described above, the routing channel quantity does not includes channels that cannot be routed due to power supply wires.

The area of the wire region that is to be provided on the outer left and right sides of the circuit block 32 may be obtained by performing processes 1 to 4. The area of the wire region that is to be provided on the outer upper and lower sides of the circuit block 32 is also obtained by performing processes 1 to 4.

When the length of the upper and lower sides of the circuit block 32 is represented by Lblock.X, the length of the left and right sides of the circuit block 32 is represented by Lblock.Y, and the length of the wire region required for the upper, lower, left, and right sides of the layout block 31 obtained through processes 1 to 4 are respectively represented by LT, LB, LL, and $L_R$, the area Ablock-add of the circuit block 32 to which the wire region 33 is added (i.e., layout block 31) may be calculated with the next equation 16.

$$A_{block-add} = (L_{block.X} + L_L + L_R) \times (L_{block.Y} + L_T + L_B) \qquad \text{Equation 16}$$

Accordingly, the total value $A_{block-add-all}$ of the area of the layout block including the required wire regions for all of the circuit blocks configured on the core section is represented by the next equation 17.

$$A_{block-add-all} = \Sigma A_{block-add} \qquad \text{Equation 17}$$

The procedure for calculating the area (total value) of the repeater cells used to connect circuit blocks will now be discussed.

The total value of the repeater cell area may be obtained from the product of the quantity Nbuffer of the repeater cells configured in the core section and the estimated area $A_{buffer}$ of each repeater cell.

The repeater cell quantity $N_{buffer}$ of the core section may be calculated from the following equation 18.

$$N_{buffer} = 0 \times \int_1^{1r} i(1)d1 + 1 \times \int_{1r}^{2lr} i(1)d1 + \qquad \text{Equation 18}$$
$$2 \times \int_{2lr}^{3lr} i(1)d1 + \ldots + z \times \int_{zlr}^{2\sqrt{N}} i(1)d1$$

$$i(1) = \frac{\alpha k}{2} \Gamma\left(\frac{1^3}{3} - 2\sqrt{N_{block}}\, 1^2 + 2N1\right) 1^{2p-4}$$
$$\left(1 \le 1 \le \sqrt{N_{block}}\right)$$

$$i(1) = \frac{\alpha k}{6} \Gamma\left(2\sqrt{N_{block}} - 1\right)^3 1^{2p-4}$$
$$\left(\sqrt{N_{block}} \le 1 \le 2\sqrt{N_{block}}\right)$$

$$k = \frac{(m_{avg} + 1)J}{N_{block}(1 - N_{block}^{p-1})}$$

$z$ is the maximum integer satisfying $$z \cdot I_r < Z\sqrt{N_{block}}$$

The gate pitch, which is represented by Ir may be calculated from the following equation and obtained from the average layout block area $A_{block-add-avg}$, which may be calculated from the total value $A_{block-add-all}$ of the area of the layout block.

$$1_r = (A_{block-add-avg})^{0.5}/d_r \qquad \text{Equation 19}$$

Accordingly, the total area $A_{buffer}$-total of the repeater cell may be calculated from the following equation 20.

$$A_{buffer-total} = A_{buffer} \times N_{buffer} \qquad \text{Equation 20}$$

Therefore, the estimated area Acore of the core section may be obtained from the sum of the total value Ablock-add-all of the layout block area and the total value $A_{buffer-total}$ of the repeater cell area through the following equation 21.

$$A_{core} = A_{block-add-all} + A_{buffer-total} \qquad \text{Equation 21}$$

The estimation of the core size in an exemplary embodiment enables the minimum area (core size) of the core section configured by a plurality of circuit blocks to be accurately estimated.

The second embodiment includes the advantages that when the core section is configured by a plurality of circuit blocks, the core size may be estimated as being the total area of the area of each circuit block, the wire region required when connecting circuit blocks, and the area of repeater cells that connect circuit blocks. This enables the minimum area of the core section, which is configured by a plurality of circuit blocks, to be accurately estimated.

It should be apparent to those skilled in the art that the present invention may be embodied in many other specific forms without departing from the spirit or scope of the invention. Particularly, it should be understood that the present invention may be embodied in the following forms.

In the procedure of the first embodiment that determines the provisional quantity and provisional locations of the power supply pads (FIG. 4), processing may be started in a state in which one power supply pad is provided for each side of a chip (the potential at each pad being the same). Then, power supply pads are added in accordance with the comparison between the value of the current flowing through each pad and the current capacity of the IO buffer.

In the first embodiment, the criterion for selecting the reference pad Ps may be changed.

In addition to a core section having a plurality of circuit blocks, the core size estimation of the second embodiment may be performed on a core section having only one circuit block.

The embodiments can be implemented in computing hardware (computing apparatus) and/or software, such as (in a non-limiting example) any computer that can store, retrieve, process and/or output data and/or communicate with other computers The results produced can be displayed on a display of the computing hardware, A program/software implementing the embodiments may be recorded on computer-readable media comprising computer-readable recording media. The program/software implementing the embodiments may also be transmitted over transmission communication media. Examples of the computer-readable recording media include a magnetic recording apparatus, an optical disk, a magneto-optical disk, and/or a semiconductor memory (for example, RAM, ROM, etc.). Examples of the magnetic recording apparatus include a hard disk device (HDD), a flexible disk (FD), and a magnetic tape (MT), Examples of the optical disk include a DVD (Digital Versatile Disc), a DVD-RAM, a CD-ROM (Compact Disc-Read Only Memory), and a CD-R (Recordable)/RW. An example of communication media includes a carrier-wave signal.

Further, according to an aspect of the embodiments, any combinations of the described features, functions and/or operations can be provided.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A method for estimating the size of a core section of a semiconductor integrated circuit, wherein the core section includes a plurality of nets, each including a plurality of wires, the method comprising:
    calculating, by a processor, an average path length of the wires in each net based on cell quantity, average cell area, total macro area, and cell usage rate to calculate a total net length of the wires of the nets;
    estimating, by the processor, a core section area based on the cell quantity, the average cell area, the cell usage rate and Rent's exponent to calculate usable channel length of the core section, the total net length of the wires being the sum of the lengths of a plurality of first wires extending in a predetermined first direction within the core section and the lengths of a plurality of second wires extending in a second direction perpendicular to the first direction within the core section, and the usable channel length being the sum of a channel length in the first direction and a channel length in the second direction within the core section;
    calculating, by the processor, a total length of the first wires within the core section;
    calculating, by the processor, a total length of the second wires within the core section; and
    determining, by the processor, the size of the core section, which is the minimal area that satisfies conditions of the total net length of the wires being less than or equal to the usable channel length within the core section, the total length of the first wires being less than or equal to the channel length in the first direction within the core section, and the total length of the second wires being less than or equal to the channel length in the second direction within the core section.

2. The method according to claim 1, further comprising:
    determining, by the processor, whether the conditions are satisfied; and
    changing, by the processor, the layout parameter and repeating said calculating the total net length of the wires of the nets and usable channel lengths, the total length of the first wires, and the total length of the second wires, and said determining the size of the core section until the conditions are satisfied.

3. The method according to claim 1, wherein the core section is provided with a plurality of wire layers, each wire layer including at least one circuit block, the nets are each arranged on one of the wire layers, each net having paths, the quantity of which is in accordance with the fan-out of the net, the layout parameter includes an aspect ratio of each circuit, and the circuit information includes the fan-out of each net said calculating the total net length of the wires includes:
    calculating, by the processor, the net length of each net based on the average path length and fan-out of each net to calculate the total net length of the nets and
    calculating the lengths of the first wires and the lengths of the second wires based on the calculated total net length and the aspect ratio of each circuit block.

4. The method according to claim 1, wherein said calculating the usable channel length of the core section includes:
    calculating, by the processor, a routing prohibition channel length of each wire layer;
    calculating, by the processor, the usable channel length of each wire layer from the routing prohibition channel length and a maximum channel usage rate, which is in accordance with the area of the estimated area, to calculate the total usable channel length of the wire layers;
    calculating, by the processor, the usable channel length in the first direction by totaling the usable channel length of the first wire layers having wires arranged along the first direction; and
    calculating, by the processor, the usable channel length in the second direction by totaling the usable channel length of the second wire layers having wires arranged along the second direction.

5. A method for estimating the size of a chip for a semiconductor integrated circuit provided with at least one core section and a plurality of power supply pads, the core section including a plurality of nets, each having a plurality of wires, and each of the power supply pads being connected to the core section via an IO buffer having a predetermined current capacity, the method comprising:
    calculating, by a processor, an average path length of the wires in each net based on cell quantity, average cell area, total macro area and cell usage rate to calculate a total net length of the wires of the nets;
    estimating, by the processor, a core section area based on the cell quantity, the average cell area, the cell usage rate and Rent's exponent to calculate the usable channel length of the core section, the total net length of the wires being the sum of the lengths of a plurality of first wires extending in a predetermined first direction within the core section and the lengths of a plurality of second wires extending in a second direction perpendicular to the first direction within the core section, and the usable channel length being the sum of a channel length in the first direction and a channel length in the second direction within the core section;

determining, by the processor, the size of the core section, which is the minimal area that satisfies conditions of the total net length of the wires being less than or equal to the usable channel length within the core section, the total length of the first wires being less than or equal to the channel length in the first direction within the core section, and the total length of the second wires being less than or equal to the channel length in the second direction within the core section;

performing, by the processor, a power supply network analysis of the core section based on power consumption information of the core section and power supply wire resistance information, which includes resistances between the nodes, to calculate voltage values of the nodes within the core section;

calculating, by the processor, current values between the nodes from the voltage values of the nodes and the resistances between the nodes;

calculating, by the processor, current values of the power supply pads from the current values between the nodes;

determining, by the processor, whether there is a power supply pad for which current value exceeds the predetermined current capacity;

eliminating or adding, by the processor, a power supply pad in accordance with the determination result and determining the quantity and locations of the power supply pads to calculate the area of an IO region in accordance with the determined quantity; and totaling, by the processor, the size of the core section and the area of the IO region to calculate an estimated size of the chip.

6. An apparatus for designing a semiconductor integrated circuit having a core section provided with a plurality of nets, each including a plurality of wires, the apparatus comprising:

a storage device which stores cell quantity, average cell area, total macro area, and cell usage rate that are used to design the semiconductor integrated circuit; and a data processor in communication with the storage device, in which the data processor:

calculates an average path length of the wires in each net based on the cell quantity, the average cell area, the total macro area, and the cell usage rate to calculate a total net length of the wires of the nets;

estimate a core section area based on the cell quantity, the average cell area, the cell usage rate and Rent's exponent to calculate usable channel length of the core section, the total net length of the wires being the sum of the lengths of a plurality of first wires extending in a predetermined first direction within the core section and the lengths of a plurality of second wires extending in a second direction perpendicular to the first direction within the core section, and the usable channel length being the sum of a channel length in the first direction and a channel length in the second direction within the core section; and determines the size of the core section, which is the minimal area that satisfies conditions including the total net length of the wires being less than or equal to the usable channel length within the core section, the total length of the first wires being less than or equal to the channel length in the first direction within the core section, and the total length of the second wires being less than or equal to the channel length in the second direction within the core section.

7. An apparatus for designing a semiconductor integrated circuit provided with a core section and a plurality of power supply pads, the core section including a plurality of nodes and a plurality of nets, each net having a plurality of wires, and each of the power supply pads being connected to the core section via an IO buffer having a predetermined current capacity, the apparatus comprising:

a storage device which stores power consumption information of the core section, power supply wire resistance information, which includes resistances between the nodes, and cell quantity, average cell area, total macro area, and cell usage rate; and a data processor in communication with the storage device, in which the data processor:

calculates an average path length of the wires in each net based on cell quantity, average cell area, total macro area and cell usage rate to calculate a total net length of the wires of the nets;

estimates a core section area based on the cell quantity, the average cell area, the cell usage rate and Rent's exponent to calculate usable channel length of the core section, the total net length of the wires being the sum of the lengths of a plurality of first wires extending in a predetermined first direction within the core section and the lengths of a plurality of second wires extending in a second direction perpendicular to the first direction within the core section, and the usable channel length being the sum of a channel length in the first direction and a channel length in the second direction within the core section;

determines the size of the core section, which is the minimal area that satisfies conditions of the total net length of the wires being less than or equal to the usable channel length within the core section, the total length of the first wires being less than or equal to the channel length in the first direction within the core section, and the total length of the second wires being less than or equal to the channel length in the second direction within the core section;

performs a power supply network analysis of the core section by referring to the determined size of the core section, the power consumption information, and the power supply wire resistance information to calculate voltage values of the nodes within the core section;

calculates current values between the nodes from the voltage values of the nodes and the resistances between the nodes;

calculates current values of the power supply pads from the current values between the nodes;

determines whether there is a power supply pad for which current value exceeds the current capacity of the associated IO buffer; and eliminates or adds a power supply pad in accordance with the result of the determination to determine the quantity and locations of the power supply pads.

8. A non-transitory computer-readable storage medium comprising computer instructions stored thereon for estimating the size of a core section of a semiconductor integrated circuit, wherein the core section includes a plurality of nets, each including a plurality of wires, the computer instructions when executed by a computer performing operations including:

calculating an average path length of the wires in each net based on cell quantity, average cell area, total macro area, and cell usage rate to calculate a total net length of the wires of the nets;

estimating a core section area based on the cell quantity, the average cell area, the cell usage rate and Rent's exponent to calculate usable channel length of the core section, the total net length of the wires being the sum of the lengths of a plurality of first wires extending in a predetermined first direction within the core section and the lengths of a plurality of second wires extending in a second direction perpendicular to the first direction within the core section, and the usable channel length being the sum of a channel length in the first direction and a channel length in the second direction within the core section;

determining the size of the core section, which is the minimal area that satisfies conditions of the total net length of the wires being less than or equal to the usable channel length within the core section, the total length of the first wires being less than or equal to the channel length in the first direction within the core section, and the total length of the second wires being less than or equal to the channel length in the second direction within the core section.

* * * * *